(12) United States Patent
Kim et al.

(10) Patent No.: US 10,608,319 B2
(45) Date of Patent: Mar. 31, 2020

(54) ANTENNA MODULE

(71) Applicant: SAMSUNG ELECTRO-MECHANICS CO., LTD., Suwon-si, Gyeonggi-do (KR)

(72) Inventors: Doo Il Kim, Suwon-si (KR); Yong Ho Baek, Suwon-si (KR); Won Wook So, Suwon-si (KR); Young Sik Hur, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/105,435

(22) Filed: Aug. 20, 2018

(65) Prior Publication Data

US 2019/0221917 A1  Jul. 18, 2019

(30) Foreign Application Priority Data

Jan. 18, 2018  (KR) .................. 10-2018-0006449

(51) Int. Cl.
*H01Q 1/22*  (2006.01)
*H01Q 1/50*  (2006.01)
(Continued)

(52) U.S. Cl.
CPC ....... *H01Q 1/2283* (2013.01); *H01L 23/3121* (2013.01); *H01L 23/66* (2013.01);
(Continued)

(58) Field of Classification Search
CPC ... H01Q 1/22; H01Q 1/38; H01Q 9/04; H01L 23/31–25/16; H01L 2924/14; H01L 21/4857

See application file for complete search history.

(56) References Cited

U.S. PATENT DOCUMENTS 8,451,618 B2  5/2013 Boeck et al.
9,378,983 B2  6/2016 Choi et al.
(Continued)

FOREIGN PATENT DOCUMENTS

JP  2007-013327 A  1/2007
JP  2014-123945 A  7/2014
(Continued)

OTHER PUBLICATIONS

Korean Office Action dated Jan. 9, 2019 issued in Korean Patent Application No. 10-2018-0006449 (with English translation).
(Continued)

*Primary Examiner* — Dameon E Levi
*Assistant Examiner* — Hasan Z Islam
(74) *Attorney, Agent, or Firm* — Morgan, Lewis & Bockius LLP

(57) ABSTRACT

An antenna module includes a connection member including at least one wiring layer and at least one insulating layer; an integrated circuit (IC) disposed on a first surface of the connection member and electrically connected to at least one wiring layer; and an antenna package disposed on a second surface of the connection member, and including a dielectric layer, a plurality of antenna members, and a plurality of feed vias, wherein the antenna package further includes a chip antenna including a dielectric body and first and second electrodes, respectively disposed on first and second surfaces of the dielectric body, wherein the chip antenna is disposed to be spaced apart from the plurality of feed vias within the dielectric layer so that at least one of the first electrode or the second electrode is electrically connected to a corresponding wire of the at least one wiring layer.

19 Claims, 35 Drawing Sheets

(51) Int. Cl.
  *H01Q 19/10* (2006.01)
  *H01L 23/66* (2006.01)
  *H01L 23/31* (2006.01)
  *H01L 25/16* (2006.01)
  *H01L 23/00* (2006.01)
  *H01Q 9/04* (2006.01)
  *H01L 21/48* (2006.01)
  *H01L 23/538* (2006.01)

(52) U.S. Cl.
  CPC ............ *H01L 24/24* (2013.01); *H01L 25/16* (2013.01); *H01Q 1/50* (2013.01); *H01Q 9/0407* (2013.01); *H01Q 19/10* (2013.01); *H01L 21/4857* (2013.01); *H01L 23/5383* (2013.01); *H01L 23/5386* (2013.01); *H01L 24/16* (2013.01); *H01L 2223/6616* (2013.01); *H01L 2223/6677* (2013.01); *H01L 2224/16227* (2013.01); *H01L 2224/24265* (2013.01); *H01L 2924/1421* (2013.01)

(56) References Cited

U.S. PATENT DOCUMENTS

| | | | |
|---|---|---|---|
| 9,620,464 B2 * | 4/2017 | Baks | H01L 23/49827 |
| 9,711,465 B2 * | 7/2017 | Liao | H01L 23/66 |
| 10,170,838 B2 * | 1/2019 | Garcia | H01Q 21/28 |
| 2009/0207080 A1 | 8/2009 | Floyd et al. | |
| 2014/0140031 A1 | 5/2014 | Fujita et al. | |
| 2014/0176368 A1 | 6/2014 | Kamgaing et al. | |

FOREIGN PATENT DOCUMENTS

| | | |
|---|---|---|
| JP | 5971566 B2 | 7/2016 |
| KR | 10-0930618 B1 | 12/2009 |
| KR | 2014-0005339 A | 1/2014 |
| WO | 2012/151123 A2 | 11/2012 |

OTHER PUBLICATIONS

Office Action issued in Taiwanese Patent Application No. 107129186 dated Oct. 1, 2019, with English translation.

* cited by examiner

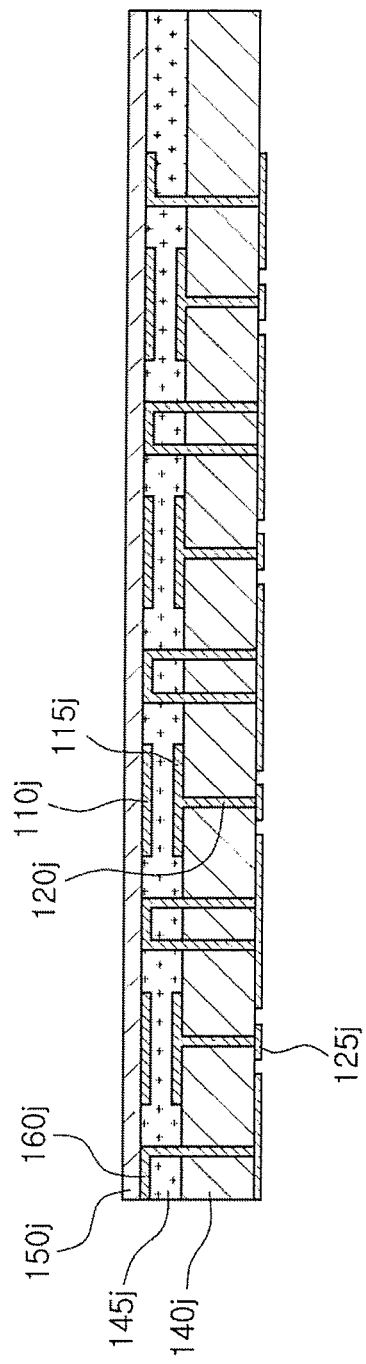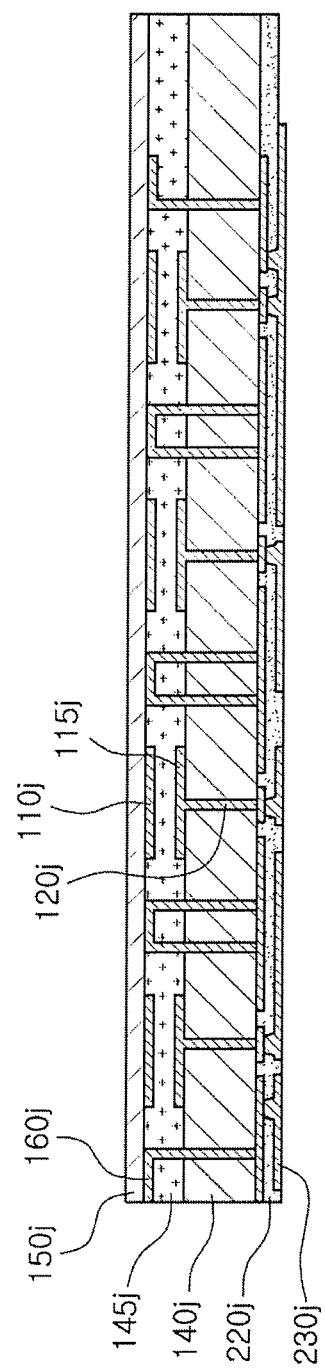

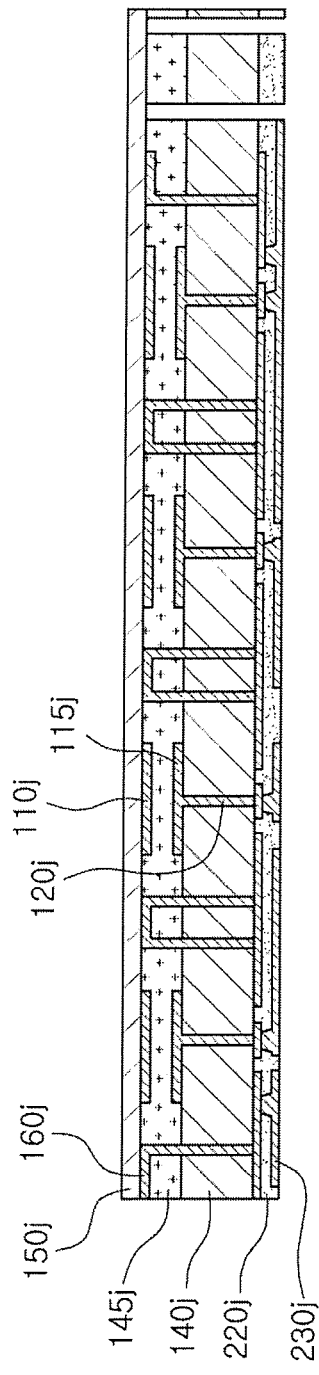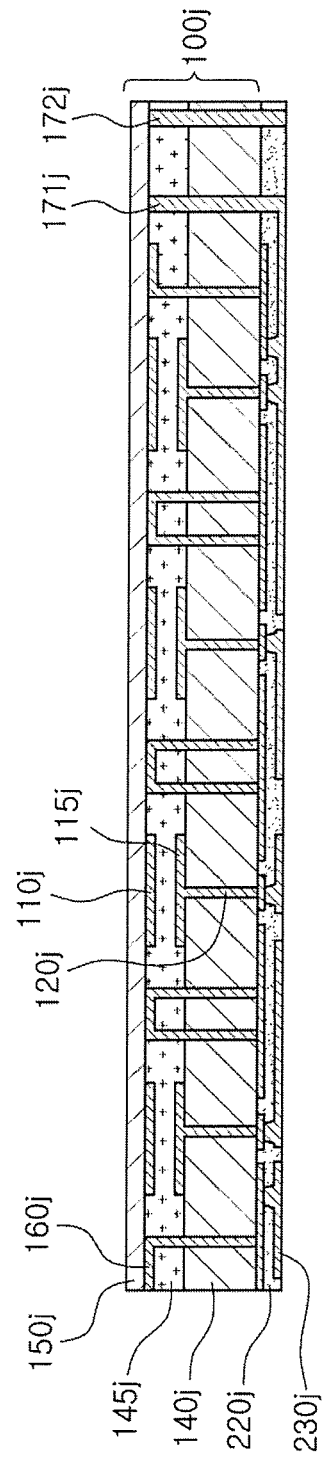

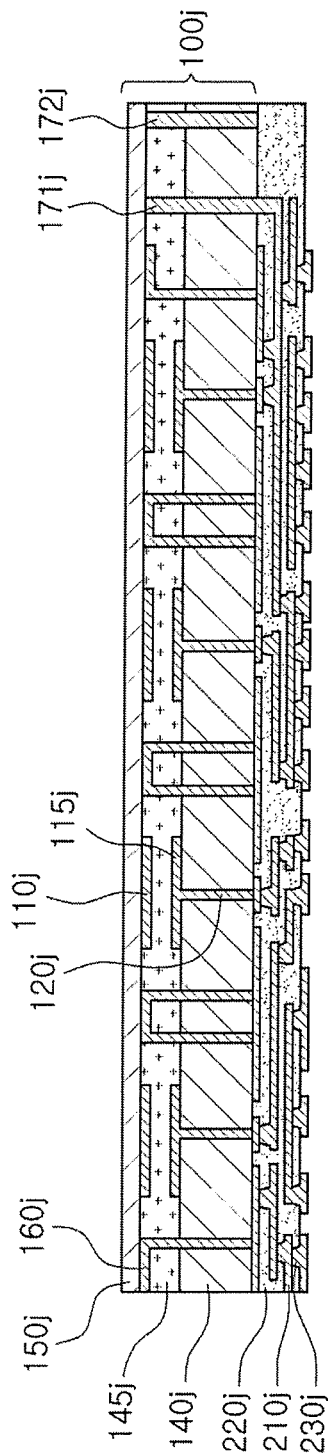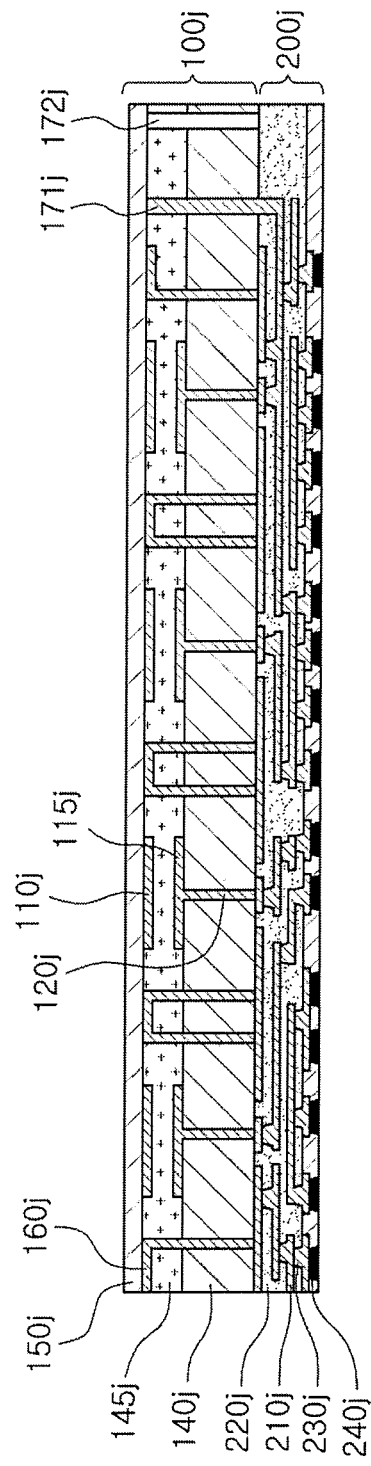

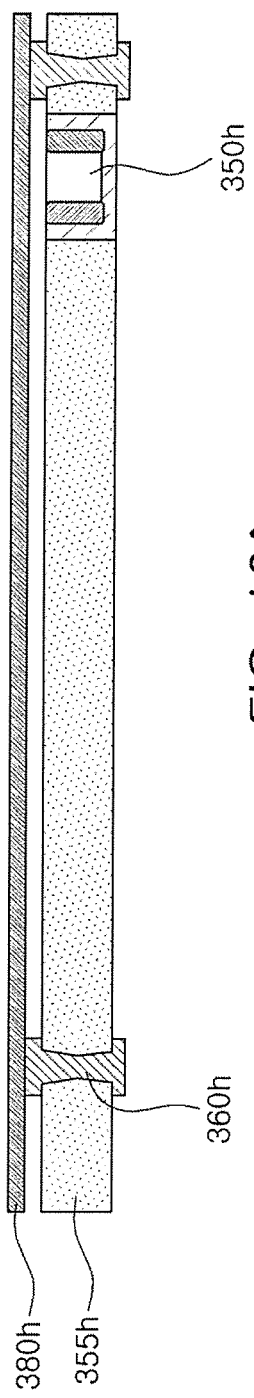
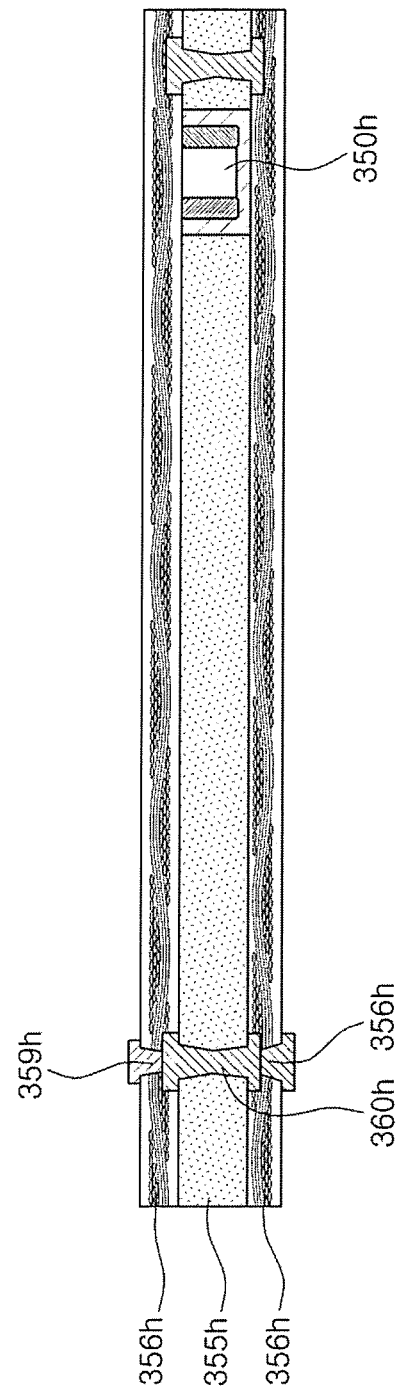
FIG. 16A
FIG. 16B

ANTENNA MODULE

CROSS-REFERENCE TO RELATED APPLICATION(S)

This application claims the benefit of priority to Korean Patent Application No. 10-2018-0006449 filed on Jan. 18, 2018 in the Korean Intellectual Property Office, the disclosure of which is incorporated herein by reference in its entirety.

TECHNICAL FIELD

The present disclosure relates to an antenna module.

BACKGROUND

Recently, millimeter wave (mmWave) communications including $5^{th}$ Generation (5G) communications have been actively researched, and research into the commercialization of an antenna module able to smoothly implement millimeter wave communications has been actively undertaken.

Conventionally, an antenna module providing a millimeter wave communications environment uses a structure in which an integrated circuit (IC) and an antenna are disposed on a board and are connected to each other by a coaxial cable in order to satisfy demand for a high level of antennal performance (e.g., a transmission and reception rate, gain, directivity, and the like) according to a high frequency.

However, such a structure may cause a shortage of an antenna layout space, a restriction of the degree of freedom of an antenna shape, an increase in interference between the antenna and the IC, and an increase in the size/cost of the antenna module.

SUMMARY

An aspect of the present disclosure may provide an antenna module capable of improving transmission and reception performance of a radio frequency (RF) signal in a first direction, being easily miniaturized, and improving the transmission and reception performance of the RF signal in a second direction by using an antenna package providing an environment capable of easily securing antenna performance.

According to an aspect of the present disclosure, an antenna module may include a connection member including at least one wiring layer and at least one insulating layer; an integrated circuit (IC) disposed on a first surface of the connection member and electrically connected to the at least one wiring layer; and an antenna package disposed on a second surface of the connection member, and including a dielectric layer, a plurality of antenna members configured to transmit and/or receive a first radio frequency (RF) signal, and a plurality of feed vias in which a first end of each thereof is electrically connected to each of the plurality of antenna members and a second end of each thereof is electrically connected to a corresponding wire of the at least one wiring layer, wherein the antenna package further includes a chip antenna including a dielectric body, and a first electrode and a second electrode respectively disposed on first and second surfaces of the dielectric body, wherein the chip antenna is disposed to be spaced apart from the plurality of feed vias within the dielectric layer so that at least one of the first electrode or the second electrode is electrically connected to a corresponding wire of the at least one wiring layer, and configured to transmit and/or receive a second RF signal. According to another aspect of the present disclosure, an antenna module may include a connection member including at least one wiring layer and at least one insulating layer; an integrated circuit (IC) disposed on a first surface of the connection member and electrically connected to at least one wiring layer; an antenna package disposed on a second surface of the connection member, and including a dielectric layer, a plurality of antenna members configured to transmit and/or receive a first radio frequency (RF) signal, and a plurality of feed vias in which a first end of each thereof is electrically connected to each of the plurality of antenna members and a second end of each thereof is electrically connected to a corresponding wire of the at least one wiring layer; and a chip antenna including a dielectric body, and a first electrode and a second electrode respectively disposed on first and second surfaces of the dielectric body, wherein the chip antenna is disposed on the first surface of the connection member so that at least one of the first or the second electrode is electrically connected to a corresponding wire of the at least one wiring layer, and configured to transmit and/or receive a second RF signal.

BRIEF DESCRIPTION OF DRAWINGS

The above and other aspects, features and other advantages of the present disclosure will be more clearly understood from the following detailed description taken in conjunction with the accompanying drawings, in which:

FIGS. 10A through 10G are views illustrating an example of a third manufacturing method of an antenna module according to an exemplary embodiment in the present disclosure;

FIG. 16A is a schematic view illustrating a first step of an example of a process of manufacturing an IC package according to an exemplary embodiment in the present disclosure;

FIG. 16B is a schematic view illustrating a second step of an example of a process of manufacturing an IC package according to an exemplary embodiment in the present disclosure;

DETAILED DESCRIPTION

Hereinafter, exemplary embodiments of the present disclosure will now be described in detail with reference to the accompanying drawings.

Figure 1:
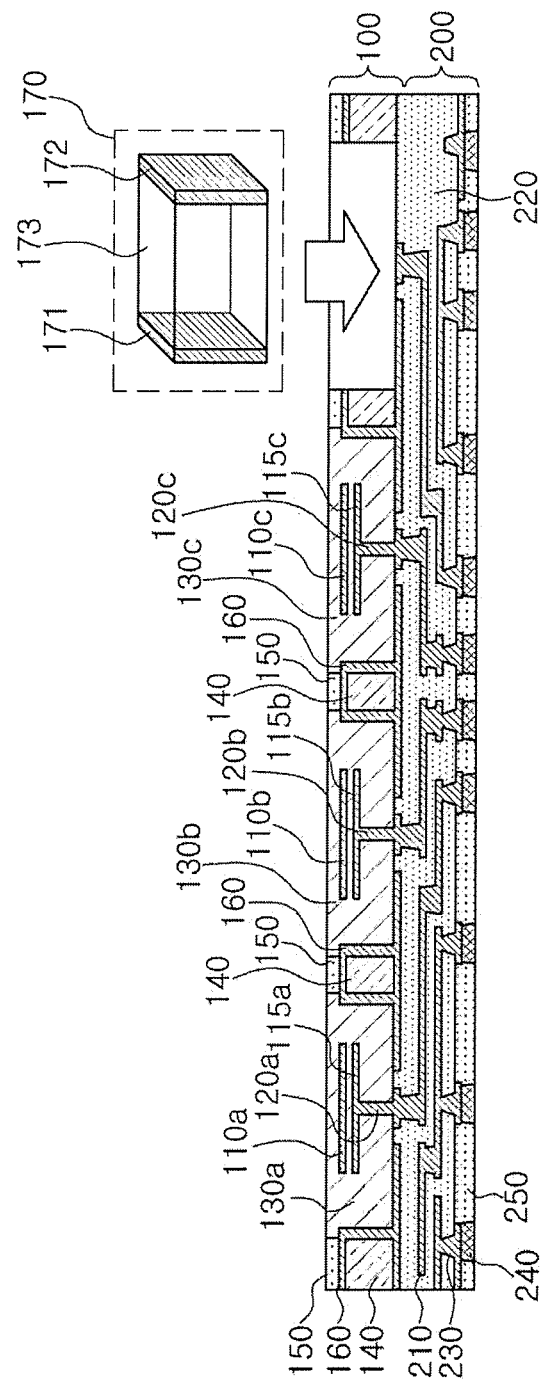
FIG. 1 is a view illustrating an example of an antenna module and an example of a chip antenna according to an exemplary embodiment in the present disclosure.

FIG. 1 is a view illustrating an example of an antenna module and an example of a chip antenna according to an exemplary embodiment in the present disclosure.

Referring to FIG. 1, an antenna module according to an exemplary embodiment in the present disclosure may have a heterogeneous structure in which an antenna package 100 and a connection member 200 are coupled to each other. That is, the antenna module may be miniaturized while improving antenna performance (e.g., a transmission and reception rate, a gain, directivity, and the like) by utilizing both characteristics that are easy to improve the antenna performance of the antenna package 100 and characteristics that are easy to dispose a circuit pattern or an integrated circuit (IC) of the connection member 200.

The connection member 200 may include at least one wiring layer 210 and at least one insulating layer 220. The connection member 200 may further include a wiring via 230 connected to the at least one wiring layer 210, a connection pad 240 connected to the wiring via 230, and a passivation layer 250 and may have a structure similar to a copper redistribution layer (RDL). Dielectric layers 130a, 130b, 130c, and 140 may be disposed on an upper surface of the connection member 200.

The antenna package 100 may include antenna members 115a, 115b, and 115c configured to transmit or receive a radio frequency (RF) signal, feed vias 120a, 120b, and 120c in which one end of each thereof is electrically connected to each of the antenna members 115a, 115b, and 115c and the other end of each thereof is electrically connected to a corresponding wire of at least one wiring layer 210, dielectric layers 130a, 130b, 130c, and 140 disposed to surround side surfaces of the feed vias 120a, 120b, and 120c and having a height greater than that of at least one insulating layer 220, and a plating member 160 surrounding side surfaces of the dielectric layers 130a, 130b, 130c, and 140. Since the dielectric layers 130a, 130b, 130c, and 140 have the height greater than that of at least one insulating layer 220, the dielectric layers 130a, 130b, 130c, and 140 may have boundary conditions (e.g., small manufacturing tolerance, a short electrical length, a smooth surface, a free design of a dielectric constant, a long straight distance of feed vias, and the like) which are advantageous in securing a radiation pattern.

Here, the antenna package 100 may further include a chip antenna 170 configured to transmit or receive a second RF signal in a second direction.

The chip antenna 170 may include a dielectric body 173 and first and second electrodes 171 and 172 each disposed on first and second surfaces of the dielectric body 173, and may be disposed to be spaced apart from the plurality of feed vias 120a, 120b, and 120c within the dielectric layers 130a, 130b, 130c, and 140 so that the first or second electrode 171 or 172 is electrically connected to a corresponding wire of at least one wiring layer 210. Accordingly, since the chip antenna 170 may form a stronger radiation pattern in a direction in which the surface of the first or second electrode 171 or 172 is viewed, directivity in the direction in which the surface of the first or second electrode 171 or 172 is viewed may be improved.

For example, the first electrode 171 may be electrically connected to the corresponding wire of at least one wiring layer 210 and the second electrode 172 may be spaced apart from at least one wiring layer 210. Accordingly, the first electrode 171 may serve as a radiator of an antenna and the second electrode 172 may serve as a director of the antenna.

For example, a size of the second electrode 172 may be smaller than that of the first electrode 171. Accordingly, since an electromagnetic coupling of the first electrode 171 to the second electrode 172 may be further concentrated, directivity of the chip antenna 170 may be further improved.

The chip antenna 170 may be disposed so that the direction in which the surface of the first or second electrode 171 or 172 is viewed is different from a direction from the other end of each of the plurality of feed vias 120a, 120b, and 120c to one end of each thereof. Accordingly, the antenna module may omni-directionally expand the transmission and reception direction of the RF signal.

For example, the chip antenna 170 may be inserted into insertion spaces of the dielectric layers 130a, 130b, 130c, and 140, may be formed together with the plurality of feed vias 120a, 120b, and 120c or the plating member 160, or may be filled immediately before the connection member 200 is disposed.

The dielectric body 173 included in the chip antenna 170 may have a dielectric constant Dk greater than that of at least one insulating layer. The large dielectric constant of the dielectric body 173 may reduce a size necessary to secure antenna performance of the chip antenna 170 and improve a degree of design freedom of antenna performance. In addition, the large dielectric constant of the dielectric body 173 may further compress the electromagnetic coupling of the first electrode 171 to the second electrode 172, thereby improving antenna performance of the chip antenna 170.

Depending on a design, the dielectric body 173 may have the dielectric constant greater than those of the dielectric layers 130a, 130b, 130c, and 140. For example, the dielectric constants of the dielectric layers 130a, 130b, 130c, and 140 may be designed with greater focus on improving structural stability of the antenna module or efficiency of a process of manufacturing an antenna package 100 by a margin of design conditions of the antenna members 115a, 115b, and 115c due to a long height of the dielectric layers 130a, 130b, 130c, and 140, and the dielectric body 173 may be designed to further focus the transmission and reception performance of a second RF signal for omni-directional balancing of the RF signal transmission and reception direction of the antenna module.

For example, since the dielectric body 173 may easily have the large dielectric constant according to an independent manufacturing of the chip antenna 170, the chip antenna 170 may be inserted into the antenna package 100 after being independently manufactured.

Meanwhile, the dielectric body 173, the dielectric layers 130a, 130b, 130c, and 140, and at least one insulating layer 220 may be formed of a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), a photo imagable dielectric (PID) resin, generic copper clad laminate (CCL), or a glass or ceramic based insulating material.

In a case in which the dielectric constant of the dielectric body 173, the dielectric constants of the dielectric layers 130a, 130b, 130c, and 140, and the dielectric constant of at least one insulating layer 220 are implemented to be different from one another, the dielectric body 173 may be formed of glass, ceramic, or silicon having a very large (e.g., 10 or more) dielectric constant, the dielectric layers 130a, 130b, 130c, and 140 may be formed of glass, ceramic, or silicon having a large (e.g., 5 or more) dielectric constant, and at least one insulating layer 220 may be formed of copper clad laminate (CCL) or prepreg having a relatively low Dk.

Meanwhile, the antenna package 100 may further include a plurality of director members 110a, 110b, and 110c each disposed between a corresponding antenna member of the plurality of antenna members 115a, 115b, and 115c and an encapsulation member 150 in the dielectric layers 130a, 130b, 130c, and 140. The plurality of director members 110a, 110b, and 110c may provide a boundary condition to the corresponding antenna member so that a bandwidth of the corresponding antenna member is expanded. For example, the number of the plurality of director members 110a, 110b, and 110c may be zero or two or more depending on a bandwidth design standard or a size design standard of the antenna package 100.

In addition, the antenna package 100 may further include an encapsulation member 150 disposed on the dielectric layers 130a, 130b, 130c, and 140. The encapsulation member 150 may improve durability for impact or oxidation of the plurality of antenna members 115a, 115b, and 115c and/or the plurality of director members 110a, 110b, and 110c. For example, the encapsulation member 150 may be formed of a photo imageable encapsulant (PIE), Ajinomoto build-up film (ABF), or the like, but is not limited thereto.

When the encapsulation member 150 is applied in a liquid state, the encapsulation member 150 may permeate into the chip antenna 170. After the encapsulation member 150 permeates into the chip antenna 170, the encapsulation member 150 may be cured to a solid state. Therefore, the encapsulation member 150 may improve structural stability of the antenna module even though the encapsulation member 150 is inserted into the chip antenna 170.

In addition, the antenna package 100 may further include a plating member 160 disposed on the dielectric layers 130a, 130b, 130c, and 140 to surround each of side surfaces of the plurality of feed vias 120a, 120b, and 120c. That is, the plating member 160 may form a plurality of cavities 130a, 130b, and 130c corresponding to each of the plurality of antenna members 115a, 115b, and 115c, and provide a boundary condition for transmission and reception of the RF signal of the corresponding antenna member.

The antenna package 100 may further include a chip antenna reflector member disposed between the plurality of feed vias 120a, 120b, and 120c and the chip antenna 170. The first electrode 171 may be disposed between the chip antenna reflector member and the second electrode 172 and have a surface smaller than that of the chip antenna reflector member and greater than that of the second electrode 172.

The antenna package 100 may further include a chip antenna director member. The second electrode 172 may be disposed between the chip antenna director member and the first electrode 171 and have a surface greater than that of the chip antenna director member and smaller than that of the first electrode 171.

Figure 2:
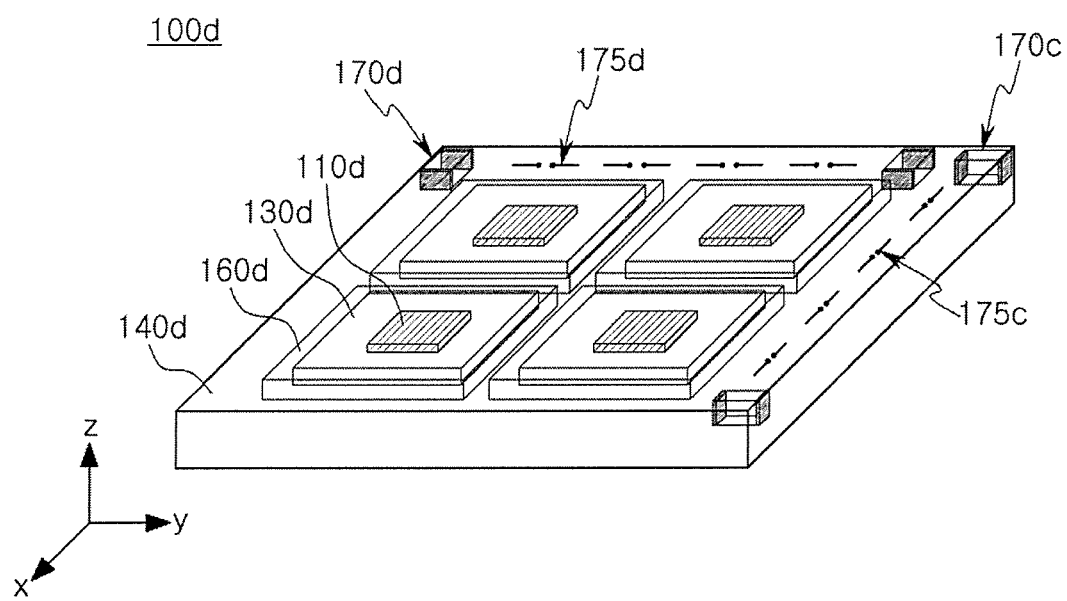
FIG. 2 is a perspective view illustrating an example of an antenna package according to an exemplary embodiment in the present disclosure.

FIG. 2 is a perspective view illustrating an example of an antenna package according to an exemplary embodiment in the present disclosure.

Referring to FIG. 2, an antenna package may include a plurality of director members 110*d*, a cavity 130*d*, a dielectric layer 140*d*, a plating member 160*d*, a plurality of chip antennas 170*c* and 170*d*, and a plurality of dipole antennas 175*c* and 175*d*.

The plurality of director members 110*d* may transmit and receive an RF signal in a z axis direction together with corresponding antenna members.

The plurality of chip antennas 170*c* and 170*d* may be disposed to be adjacent to an edge of the antenna package and stood up in a z axis direction. One of the plurality of chip antennas 170*c* and 170*d* may transmit and receive a second RF signal in an x axis direction and the other thereof may transmit and receive the second RF signal in a y axis direction. Since the plurality of chip antennas 170*c* and 170*d* may be disposed in the antenna package, the antenna module may significantly reduce a problem of a size increase due to an increase in the number of the plurality of chip antennas 170*c* and 170*d*.

A plurality of dipole antennas 175*c* and 175*d* may be disposed between the dielectric layer 140*d* and an encapsulation member to be adjacent to the edge of the antenna package, and one of the plurality of dipole antennas 175*c* and 175*d* may transmit and receive a third RF signal in the x axis direction and the other thereof may transmit and receive the third RF signal in the y axis direction. Depending on a design, at least a portion of the plurality of dipole antennas 175*c* and 175*d* may be replaced with a monopole antenna.

Figure 3:
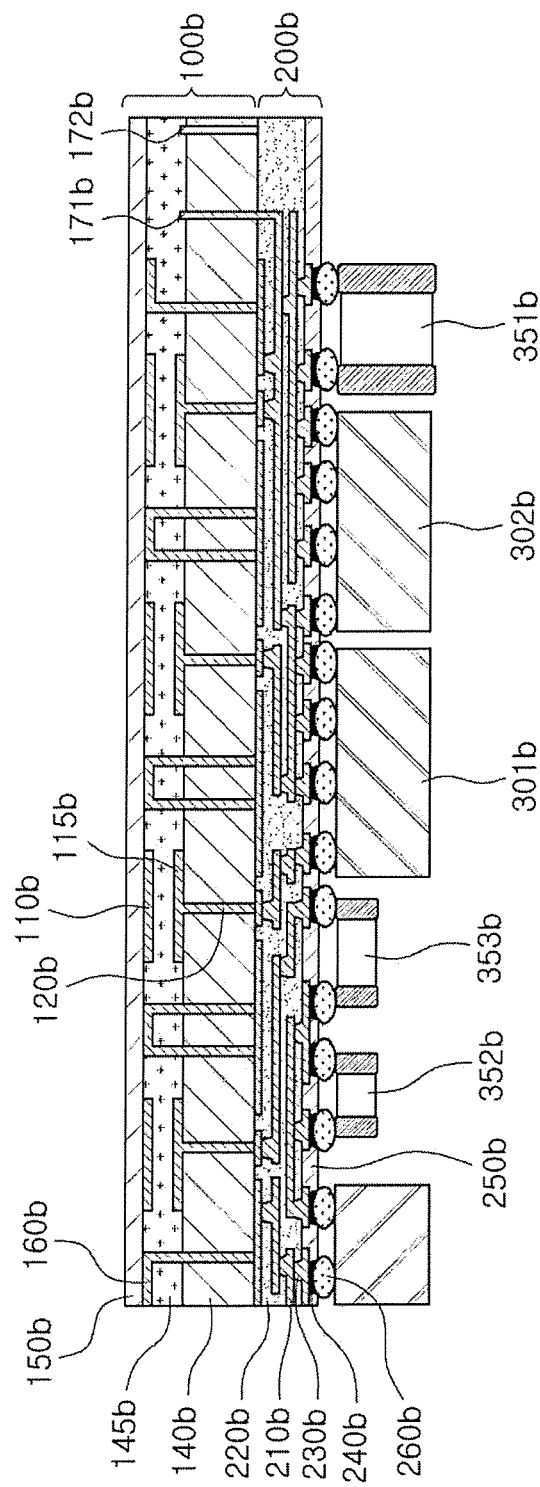
FIG. 3 is a view illustrating another example of the antenna module according to an exemplary embodiment in the present disclosure.

FIG. 3 is a view illustrating another example of the antenna module according to an exemplary embodiment in the present disclosure.

Referring to FIG. 3, an antenna module according to an exemplary embodiment in the present disclosure may include an antenna package 100*b*, a connection member 200*b*, an IC 301*b*, a power management IC (PMIC) 302*b*, and a plurality of passive components 351*b*, 352*b*, and 353*b*.

The antenna package 100*b* may include a director member 110*b*, an antenna member 115*b*, a feed via 120*b*, a dielectric layer 140*b*, an encapsulation member 150*b*, a plating member 160*b*, and a chip antenna 170*b*, and the connection member 200*b* may include at least one wiring layer 210*b*, at least one insulating layer 220*b*, a wiring via 230*b*, and a connection pad 240*b*.

The IC 301*b* may be disposed on a lower surface of the connection member 200*b*. The IC 301*b* may generate the RF signal transmitted to a plurality of antennal members 115*b* and receive the RF signal from the plurality of antenna members 115*b*.

In addition, the PMIC 302*b* may be further disposed on the lower surface of the connection member 200*b*. The PMIC 302*b* may generate power and may transmit the generated power to the IC 301*b* through at least one wiring layer 210*b* of the connection member 200*b*.

In addition, the plurality of passive components 351*b*, 352*b*, and 353*b* may be further disposed on the lower surface of the connection member 200*b*. The plurality of passive components 351*b*, 352*b*, and 353*b* may provide impedance to the IC 301*b* and/or the PMIC 302*b*. For example, the plurality of passive components 351*b*, 352*b*, and 353*b* may include at least a portion of a capacitor (e.g., a multilayer ceramic capacitor (MLCC)), an inductor, or a chip resistor.

Figure 4:
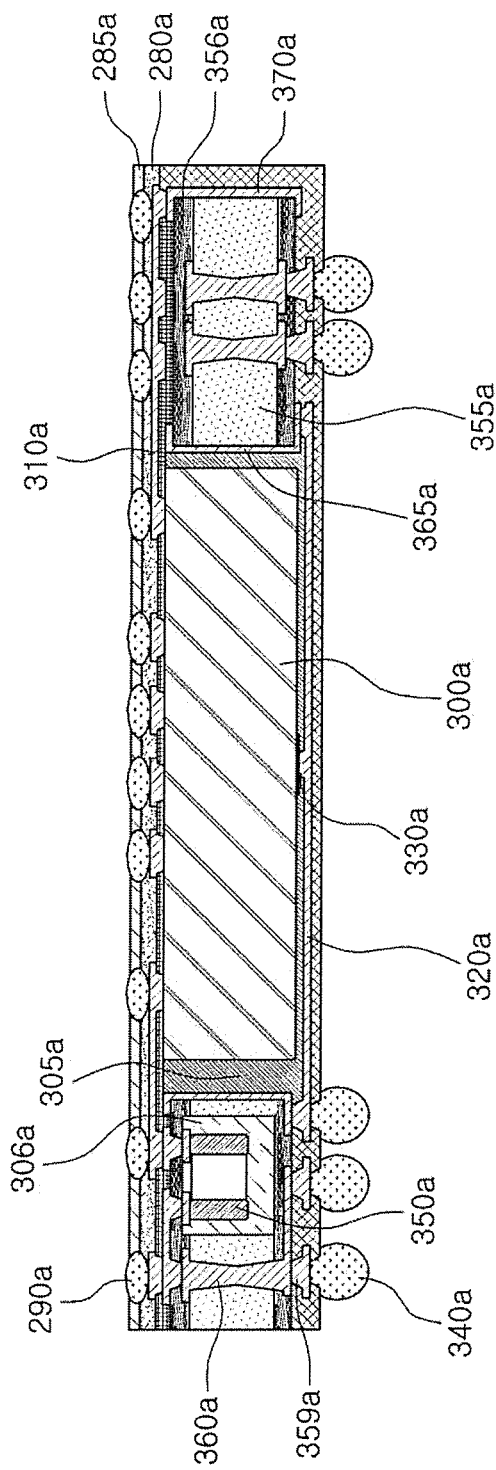
FIG. 4 is a view illustrating an example of an integrated circuit (IC) package according to an exemplary embodiment in the present disclosure.

FIG. 4 is a view illustrating an example of an integrated circuit (IC) package according to an exemplary embodiment in the present disclosure.

Referring to FIG. 4, the IC package may include an IC 300*a*, an encapsulant 305*a* encapsulating at least a portion of the IC 300*a*, a support member 355*a* disposed so that a first side surface thereof faces the IC 300*a*, at least one wiring layer 310*a* electrically connected to the IC 300*a* and the support member 355*a*, and an insulating layer 280*a*.

The IC package may be coupled to the connection member described above. A first RF signal generated from the IC 300*a* included in the IC package may be transmitted to the antenna package through at least one wiring layer 310*a* and may be transmitted in an upper surface direction of the antenna module, and the first RF signal received by the antenna package may be transmitted to the IC 300*a* through at least one wiring layer 310*a*.

The IC package may further include connection pads 330*a* disposed on an upper surface and/or a lower surface of the IC 300*a*. The connection pad disposed on the upper surface of the IC 300*a* may be electrically connected to at least one wiring layer 310*a*, and the connection pad disposed on the lower surface of the IC 300*a* may be electrically connected to a support member 355*a* or core plating members 365*a* and 370*a* through a lower end wiring layer 320*a*. Here, the core plating members 365*a* and 370*a* may provide a ground region to the IC 300*a*.

The support member 355*a* may include a core dielectric layer 356*a* in contact with the connection member, core wiring layers 359*a* disposed on an upper surface and/or a lower surface of the core dielectric layer 356*a*, and at least one core via 360*a* penetrating through the core dielectric layer 356*a*, electrically connecting the core wiring layers 359*a* to each other, and electrically connected to the connection pads 330*a*. At least one core via 360*a* may be electrically connected to an electrical connection structure 340*a* such as a solder ball, a pin, and a land.

Accordingly, the support member 355*a* may be supplied with a base signal or power from a lower surface thereof and may transmit the base signal and/or power to the IC 300*a* through at least one wiring layer 310*a*.

The IC 300*a* may generate first and second RF signals of a millimeter wave (mmWave) band using the base signal and/or power. For example, the IC 300*a* may receive a base signal of a low frequency and may perform a frequency conversion, amplification, a filtering phase control, and a power generation of the base signal, and may be formed of a compound semiconductor (e.g., GaAs) or a silicon semiconductor in consideration of high frequency characteristics. Here, frequencies of the first and second RF signals may be the same as a first frequency (e.g., 28 GHz), and may be different from each other as a first or second frequency (e.g., 28 GHz, 36 GHz) depending on a design.

Meanwhile, the IC package may further include a passive component 350*a* electrically connected to a corresponding wire of at least one wiring layer 310*a*. The passive component 350*a* may be disposed in an accommodation space 306*a* provided by the support member 355*a* and may provide impedance to the IC 300*a*. For example, the passive component 350*a* may include at least a portion of a multilayer ceramic capacitor (MLCC), an inductor, or a chip resistor.

Meanwhile, the IC package may be coupled to the antenna package through the electrical connection structure 290*a* and the passivation layer 285*a*, but the electrical connection structure 290a and the passivation layer 285a may be omitted depending on a design.

Figure 5:
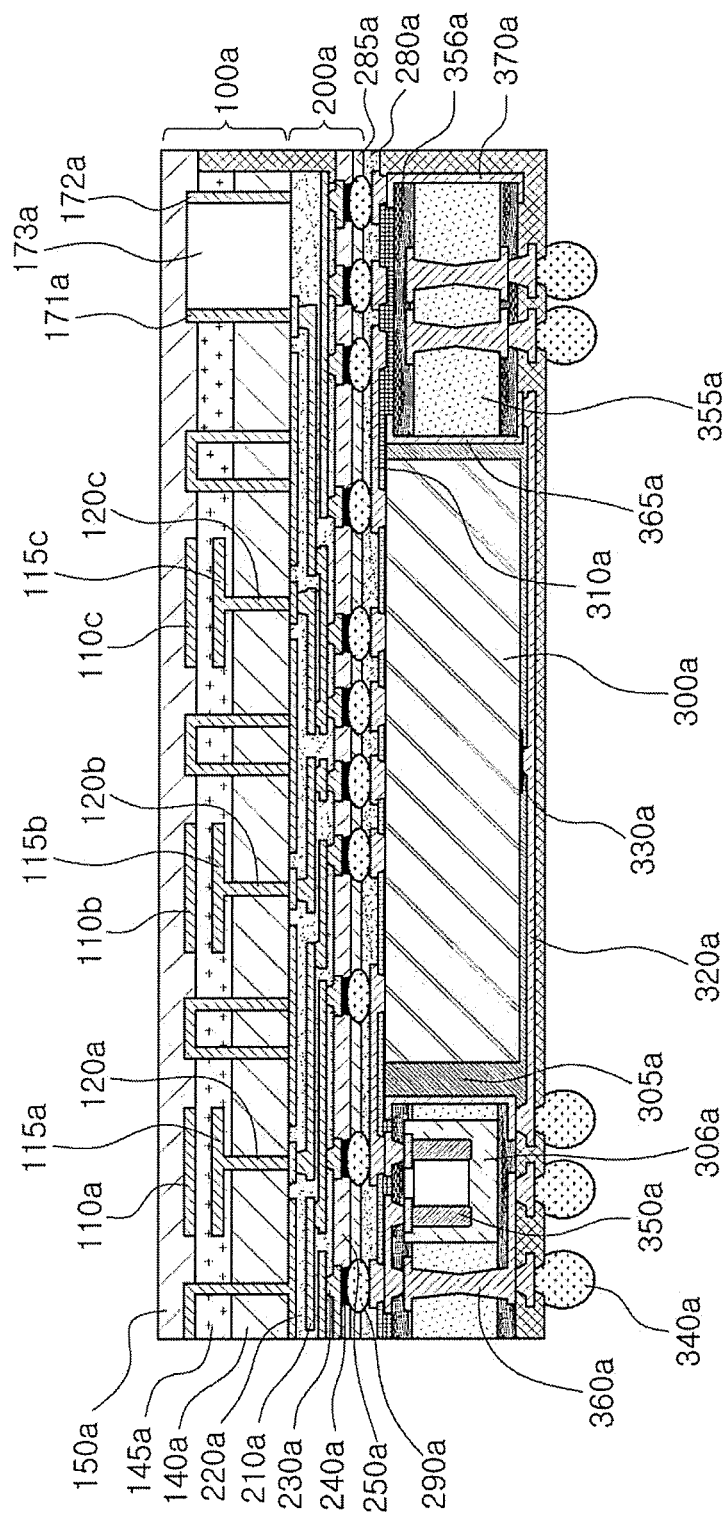
FIG. 5 is a view illustrating an example of an antenna module in which an IC package and a connection member are coupled to each other.

FIG. 5 is a view illustrating an example of an antenna module in which an IC package and a connection member are coupled to each other.

Referring to FIG. 5, the connection member 200a and the IC package may be coupled to each other through the electrical connection structure 290a. The IC package and the antenna package may be manufactured independently of each other and coupled to each other, but may also be manufactured together depending on a design. That is, a separate coupling process between a plurality of packages may be omitted.

Meanwhile, the dielectric layer 140a may have a dielectric constant greater than that of the encapsulation member 150a and/or the encapsulant 305a, and at least one insulating layer 220a may have a dielectric constant smaller than that of the encapsulation member 150a and/or the encapsulant 305a. Accordingly, the antenna package 100a may be advantageous in terms of miniaturizing by reducing the size of the dielectric layer 140a required in terms of securing the antenna performance, and the connection member 200a may reduce transmission loss of the RF signal by having a relatively small dielectric constant.

Figure 6:
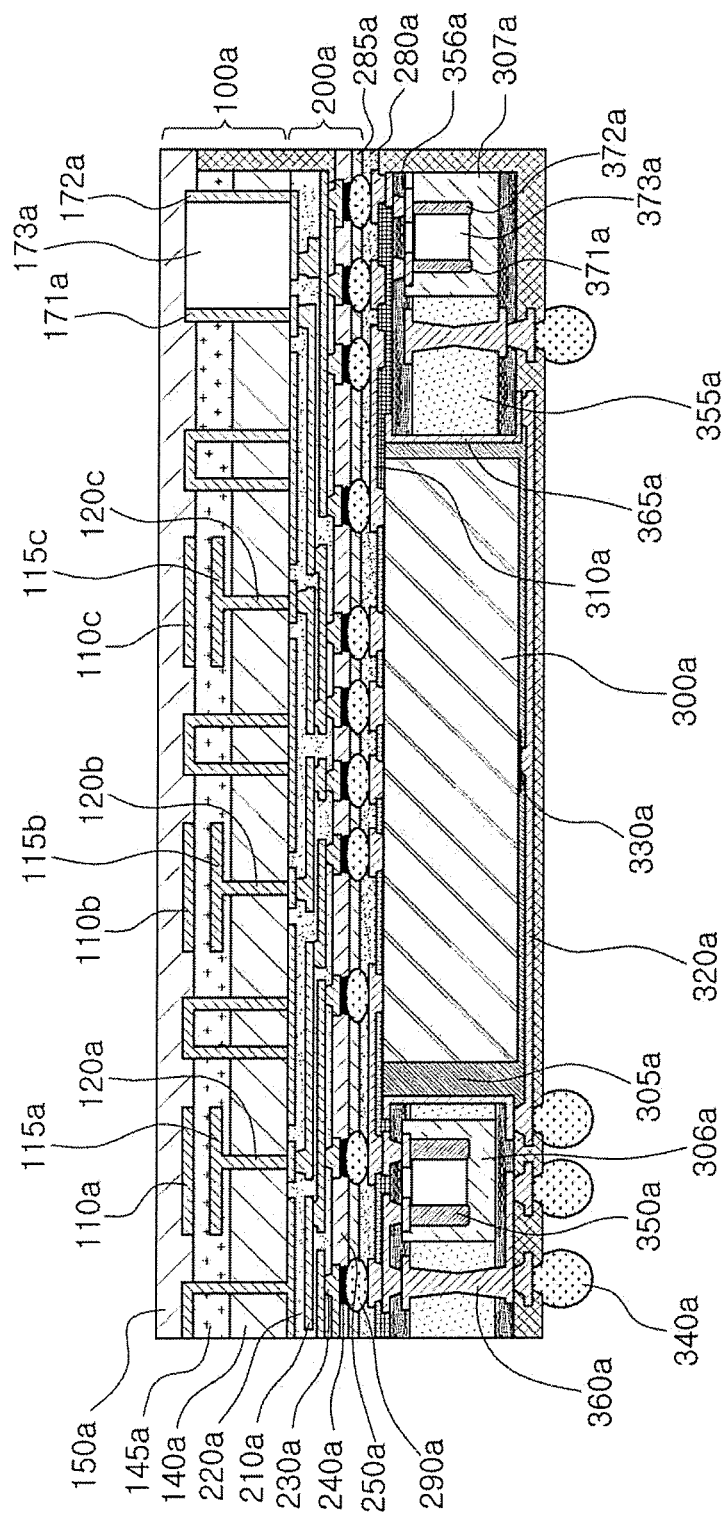
FIG. 6 is a view illustrating another example of the chip antenna according to an exemplary embodiment in the present disclosure.

FIG. 6 is a view illustrating another example of the chip antenna according to an exemplary embodiment in the present disclosure.

Referring to FIG. 6, a second chip antenna configured to include a second dielectric body 373a, and third and fourth electrodes 371a and 372a disposed on a first surface and a second surface of the second dielectric body 373a and transmit or receive a third RF signal may be included in the IC package.

For example, the second chip antenna may be disposed in an accommodating space of the support member 355a disposed on the lower surface of the connection member 200a and providing the accommodating space, but is not limited thereto, and may also be encapsulated by the encapsulant 305a without the support member 355a.

Meanwhile, depending on a design, both the first electrode 171a and the second electrode 171b in the chip antenna may be electrically connected to the wiring layer 210a. For example, the first electrode 171a may receive the second RF signal from the IC 300a and the second electrode 172a may be electrically connected to a ground of the wiring layer 210a. Accordingly, impedance characteristics of the chip antenna may be more freely designed.

Figure 7A:
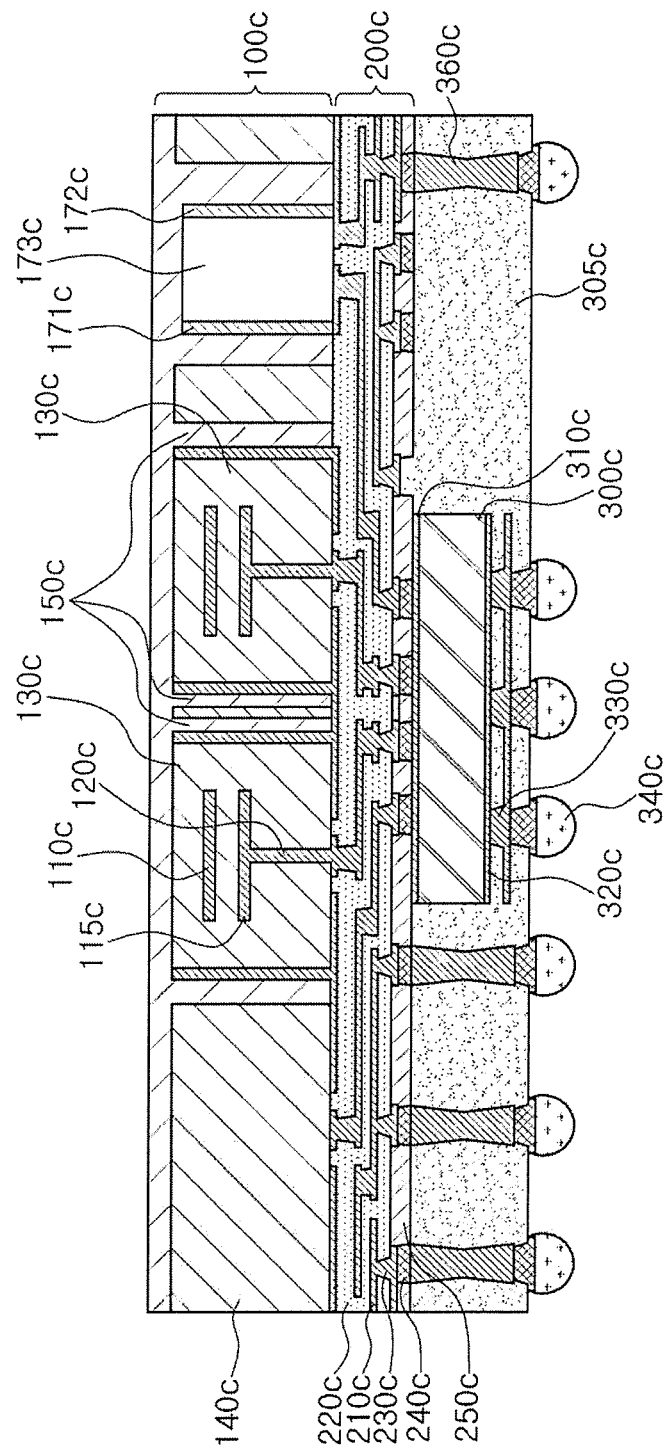
FIG. 7A is a view illustrating another example of the antenna module according to an exemplary embodiment in the present disclosure.

FIG. 7A is a view illustrating another example of the antenna module according to an exemplary embodiment in the present disclosure.

Referring to FIG. 7A, an antenna package 100c may include a director member 110c, an antenna member 115c, a feed via 120c, a cavity 130c, a dielectric member 140c, an encapsulation member 150c, first and second electrodes 171c and 172c, and a dielectric body 173c.

The dielectric layer described above with reference to FIGS. 1 through 6 is a concept including the cavity 130c and the dielectric member 140c.

The dielectric member 140c may have a dielectric constant smaller than that of the cavity 130c and may have an accommodating space in which the chip antenna including the first and second electrodes 171c and 172c and the dielectric body 173c is disposed.

The encapsulation member 150c may permeate into the accommodating space of the dielectric member 140c or between the dielectric member 140c and the cavity 130c. Accordingly, structural stability of the antenna package may be improved.

Referring to FIG. 7A, the connection member 200c may include at least one wiring layer 210c, at least one insulating layer 220c, a wiring via 230c, a connection pad 240c, and a passivation layer 250c, and the IC package may include an IC 300c, a lower end wiring layer 320c, an electrical connection structure 340c, a passive component 350c, and a core via 360c.

The IC 300c may include an active surface 310c and may be electrically connected to the connection pad 240c through the active surface 310c. That is, since the IC 300c may be disposed to be faced-up, an electrical distance up to an antenna member may be reduced and transmission loss of the RF signal may be reduced.

The lower end wiring layer 320c may be connected to a metal member 330c. The metal member 330c may radiate heat generated from the IC 300c or provide a ground to the IC 300c.

An encapsulant 305c may encapsulate at least portions of at least one core via 360c and the IC 300c.

The core via 360c may be disposed on a lower surface of the connection member to be electrically connected to a corresponding wire of at least one wiring layer 210c, and may be connected to the electrical connection structure 340c. That is, the core via 360c may be disposed independently even without support of the support member.

For example, the core via 360c may receive a base signal (e.g., power, a low frequency signal, or the like) from the electrical connection structure 340c and provide the base signal to the IC 300c. The IC 300c may generate an RF signal of a millimeter wave (mmWave) band by performing a frequency conversion, amplification, and a filtering phase control using the base signal and transmit the RF signal to the antenna package. For example, a frequency of the RF signal may be 28 GHz and/or 36 GHz, but is not limited thereto and may be varied according to a communications scheme of the antenna module.

Figure 7B:
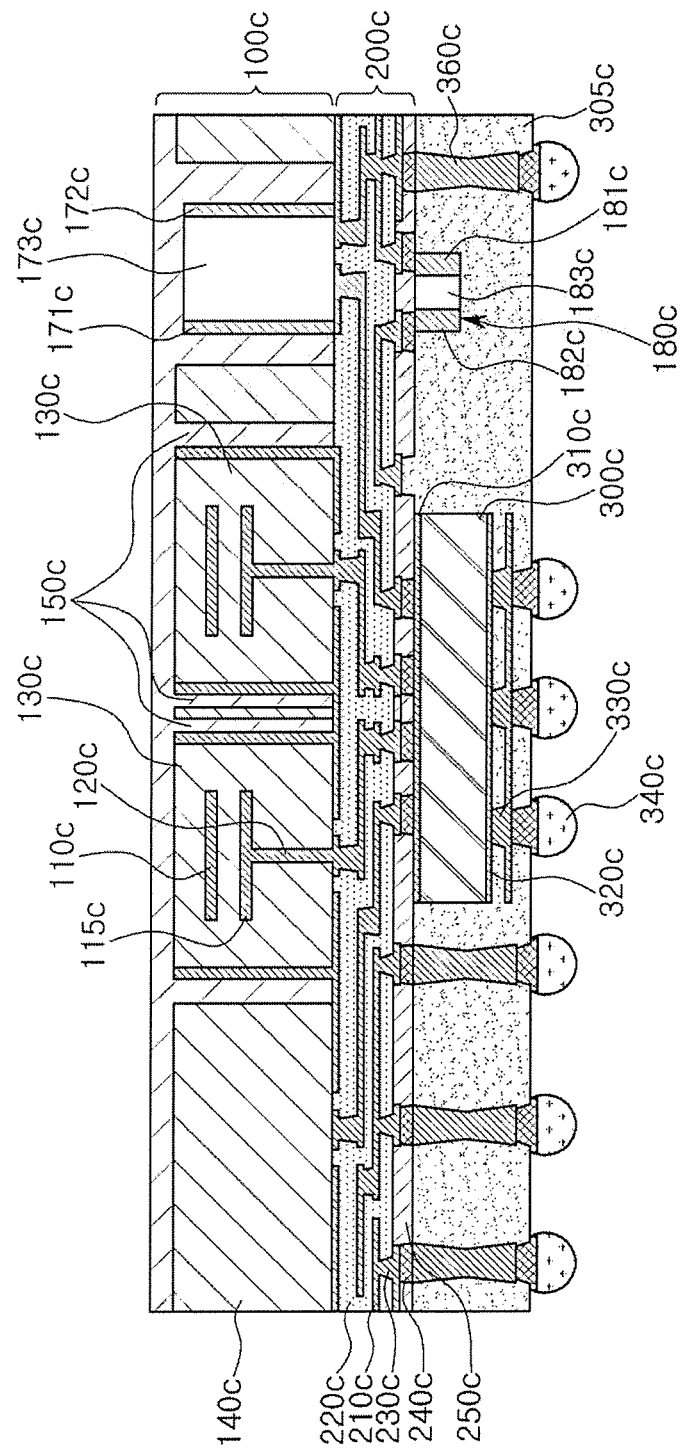
FIG. 7B is a view illustrating a second passive component for adjusting a frequency band of the chip antenna.

FIG. 7B is a view illustrating a second passive component for adjusting a frequency band of the chip antenna.

Referring to FIG. 7B, the antenna module according to an exemplary embodiment in the present disclosure may include a second passive component 180c. For example, the second passive component 180c may include a first terminal 181c connected to a first wire of at least one wiring layer 210c, a second terminal 182c connected to a second wire of at least one wiring layer 210c, and a passive component body 183c. The second passive component 180c may include a capacitor or an inductor depending on a configuration of the passive component body 183c.

The second wire connected to the second terminal 182c may not be electrically connected to the IC 300c and the first wire connected to the first terminal 181c may be electrically connected to the second electrode 172c of the chip antenna. That is, the first electrode 171c of the chip antenna may be electrically connected to the IC 300c and the second electrode 172c of the chip antenna may be electrically connected to the second passive component 180c without being connected to the IC 300c.

A frequency band of the chip antenna may be determined according to electrical lengths of the first and second wires of at least one wiring layer 210c and the electrical length may be varied depending on impedance of the second passive component 180c.

Therefore, the second passive component 180c may provide a frequency band adjustment environment of the chip antenna. Since the second passive component 180*c* and the chip antenna may be disposed on the lower surface and the upper surface of the connection member 200*c*, respectively, the impedance of the second passive component 180*c* may be freely designed without substantial interference with the design conditions of the chip antenna. Accordingly, since a degree of design freedom of the chip antenna may be improved, antenna performance of the chip antenna may be further improved.

Figure 7C:
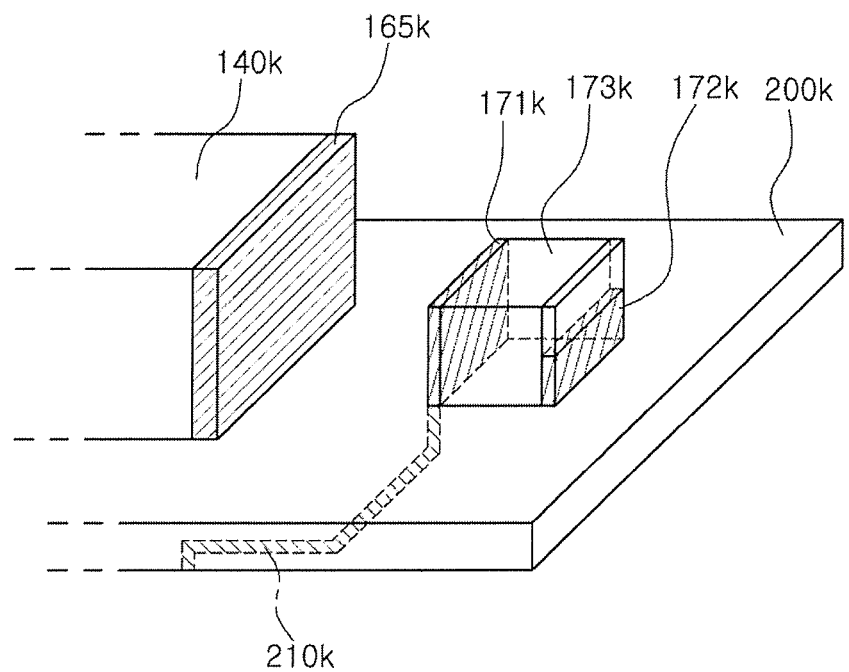
FIG. 7C is a view illustrating a portion in which the chip antenna is disposed in the antenna package.

FIG. 7C is a view illustrating a portion in which the chip antenna is disposed in the antenna package.

Referring to FIG. 7C, the antenna package on a connection member 200*k* may further include a chip antenna reflector member 165*k*. The chip antenna reflector member 165*k* may be plated on a side surface of a dielectric layer 140*k*, but is not limited thereto.

A first electrode 171*k* of the chip antenna may be disposed between the chip antenna reflector member 165*k* and a second electrode 172*k* and may be electrically connected to an IC through at least one wiring layer 210*k*. Accordingly, the first electrode 171*k* may serve as a radiator and the second electrode 172*k* may serve as a director.

That is, the chip antenna reflector member 165*k* may reflect an RF signal transmitted through one surface of the first electrode 171*k*, and the second electrode 172*k* and a dielectric body 173*k* may focus an RF signal transmitted through the other surface of the first electrode 171*k*. Therefore, a gain of the chip antenna may be further improved.

The first electrode 171*k* may have a surface smaller than that of the chip antenna reflector member 165*k* and greater than that of the second electrode 172*k*.

Figure 7D:
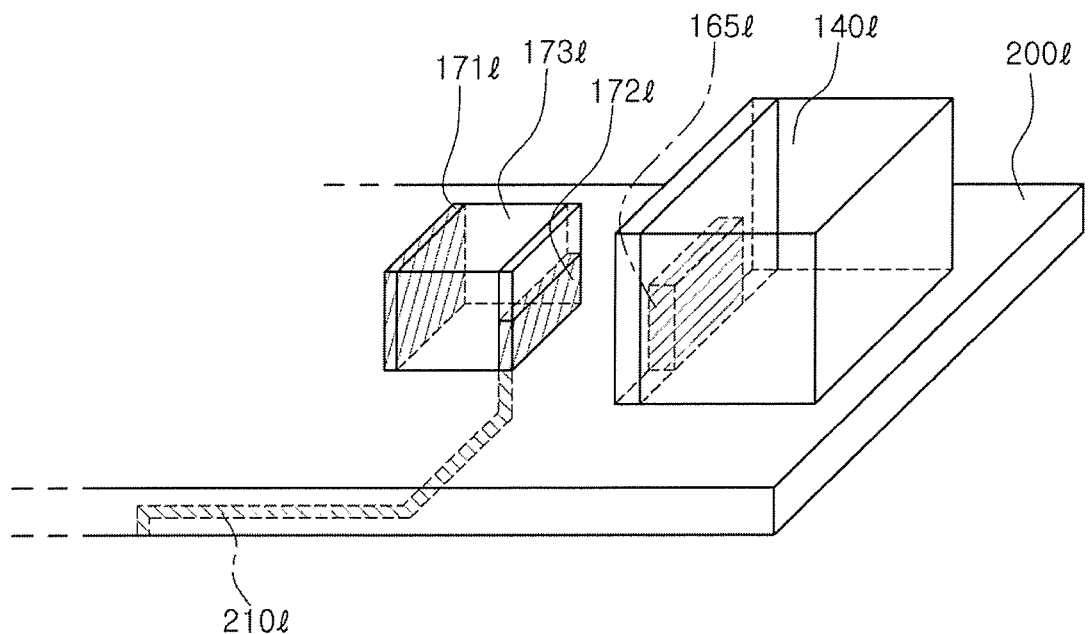
FIG. 7D is a view illustrating a portion in which the chip antenna is disposed in the antenna package.

FIG. 7D is a view illustrating a portion in which the chip antenna is disposed in the antenna package.

Referring to FIG. 7D, the antenna package on a connection member 200*l* may further include a chip antenna director member 165*l*. The chip antenna director member 165*l* may be plated on a side surface of a dielectric layer 140*l*, but is not limited thereto.

A second electrode 172*l* of the chip antenna may be disposed between the chip antenna director member 165*l* and a first electrode 171*l* and may be electrically connected to an IC through at least one wiring layer 210*l*. Accordingly, the first electrode 171*l* may serve as a reflector and the second electrode 172*l* may serve as a radiator.

That is, the first electrode 171*l* may reflect an RF signal transmitted through one surface of the second electrode 172*l* through a dielectric body 173*l* and the chip antennal director member 165*l* may focus an RF signal transmitted through the other surface of the second electrode 172*l*. Therefore, a gain of the chip antenna may be further improved.

The second electrode 172*l* may have a surface greater than that of the chip antenna director member 165*l* and smaller than that of the first electrode 171*l*.

FIGS. 8A through 8E are views illustrating an example of a first manufacturing method of an antenna module according to an exemplary embodiment in the present disclosure.

Figure 8A:
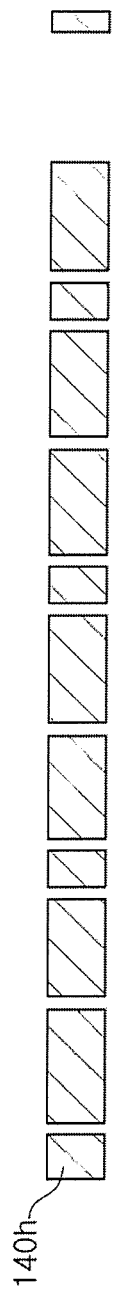
FIGS. 8A through 8E are views illustrating an example of a first manufacturing method of an antenna module according to an exemplary embodiment in the present disclosure.

Referring to FIG. 8A, a dielectric layer 140 may be provided with some regions removed.

Figure 8B:
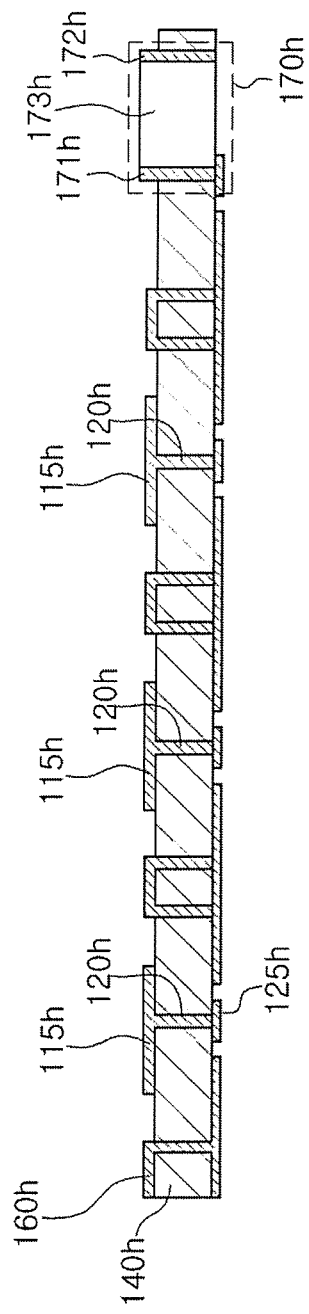

Referring to FIG. 8B, a feed via 120*h* and a plating member 160*h* may be filled in some regions, an antenna member 115*h* may be disposed on an upper surface of the dielectric layer 140*h*, and an electrical connection structure 125*h* may be disposed on a lower surface of the dielectric layer 140*h*.

In addition, a chip antenna 170*h* including first and second electrodes 171*h* and 172*h* and a dielectric body 173*h* may be separately manufactured and may be disposed on the upper surface of the dielectric layer 140*h*.

Figure 8C:
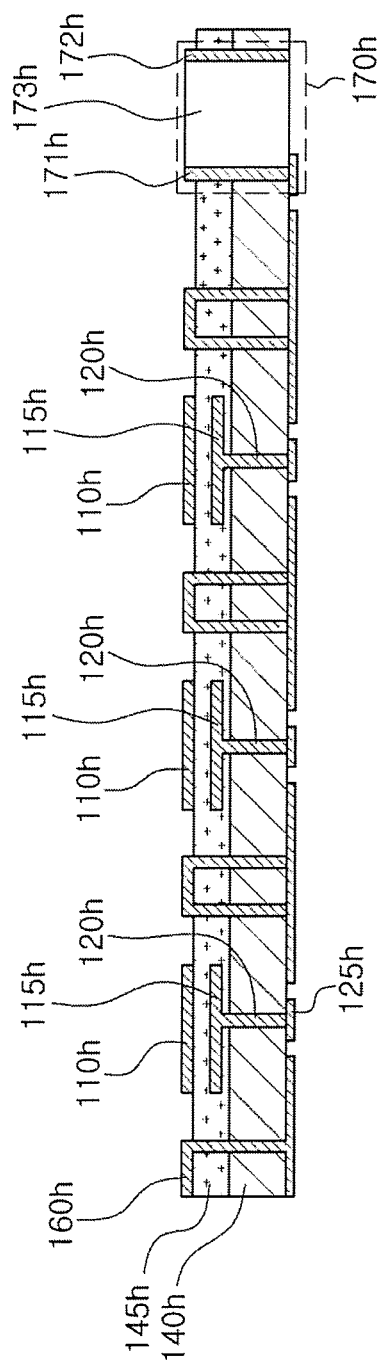

Referring to FIG. 8C, a second dielectric layer 145*h* having the same dielectric constant as that of the dielectric layer 140*h* may be disposed on the upper surface of the dielectric layer 140*h*, and a director member 110*h* may be disposed on an upper surface of the second dielectric layer 145*h*. The second dielectric layer 145*h* may be integrated with the dielectric layer 140*h* to form a single dielectric layer.

Figure 8D:
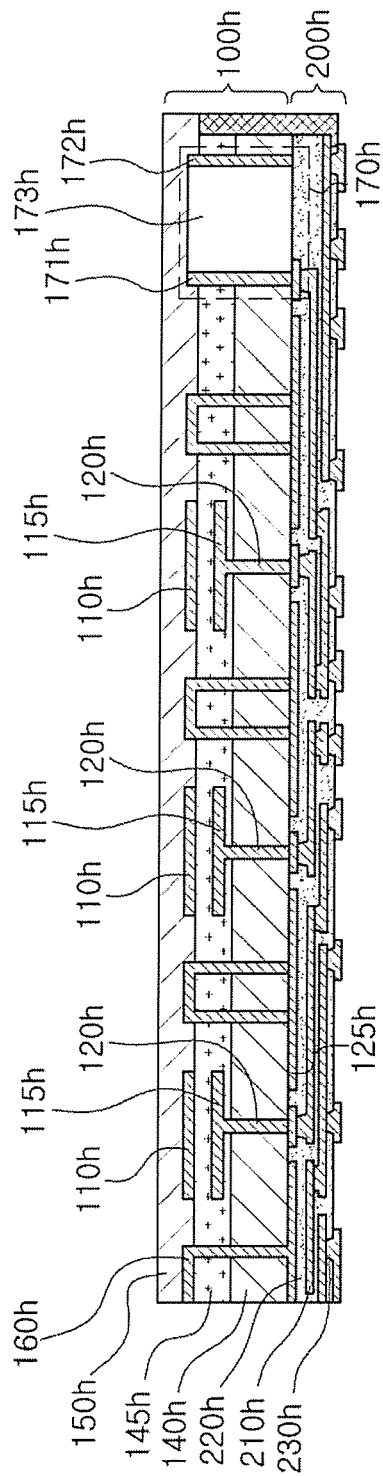

Referring to FIG. 8D, an encapsulation member 150*h* before being cured may be disposed on the upper surface of the second dielectric layer 145*h* and the upper surface of the chip antenna, and may be cured after being disposed on the upper surface of the second dielectric layer 145*h* and the upper surface of the chip antenna.

In addition, a connection member including at least one wiring layer 210*h*, at least one insulating layer 220*h*, and a wiring via 230*h* may be disposed below the electrical connection structure 125*h* and the plating member 160*h*.

Figure 8E:
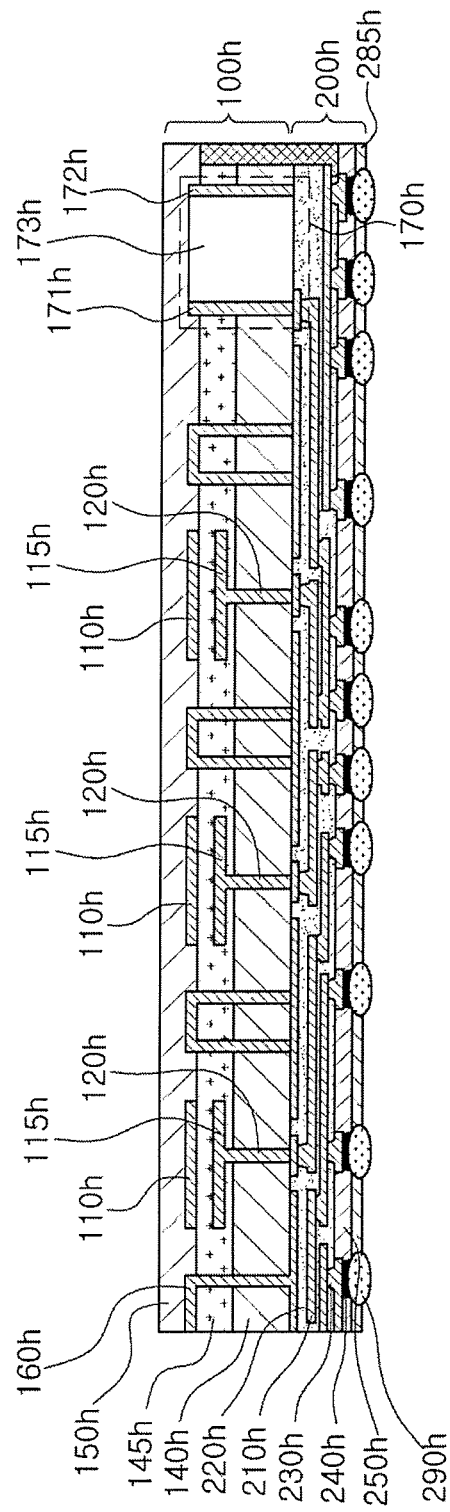

Referring to FIG. 8E, a connection pad 240*h*, a passivation layer 250*h*, and an electrical connection structure 290*h* may be disposed on the connection member. The connection member may be coupled to the IC package through the electrical connection structure 290*h*.

Meanwhile, the director member 110*h*, the antenna member 115*h*, the feed via 120*h*, the electrical connection structure 125*h*, and the plating member 160*h* may be formed according to a negative or positive printing method, and may include a metal material (e.g., a conductive material such as copper (Cu), aluminum (Al), silver (Ag), tin (Sn), gold (Au), nickel (Ni), lead (Pb), titanium (Ti), or an alloy thereof).

Meanwhile, the director member 110*h*, the antenna member 115*h*, the feed via 120*h*, the electrical connection structure 125*h*, and the plating member 160*h* may be formed by a plating method such as chemical vapor deposition (CVD), physical vapor deposition (PVD), sputtering, subtractive, additive, semi-additive process (SAP), modified semi-additive process (MSAP), or the like, but is not limited thereto.

FIGS. 9A through 9E are views illustrating an example of a second manufacturing method of an antenna module according to an exemplary embodiment in the present disclosure.

Figure 9A:
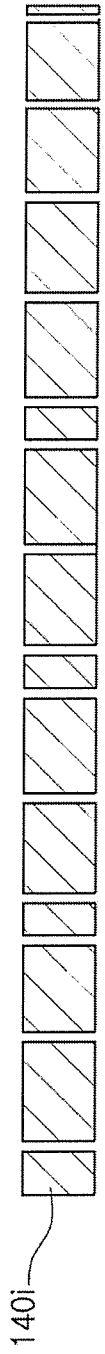
FIGS. 9A through 9E are views illustrating an example of a second manufacturing method of an antenna module according to an exemplary embodiment in the present disclosure.

Referring to FIG. 9A, a dielectric layer 140*i* may be provided with some regions removed.

Figure 9B:
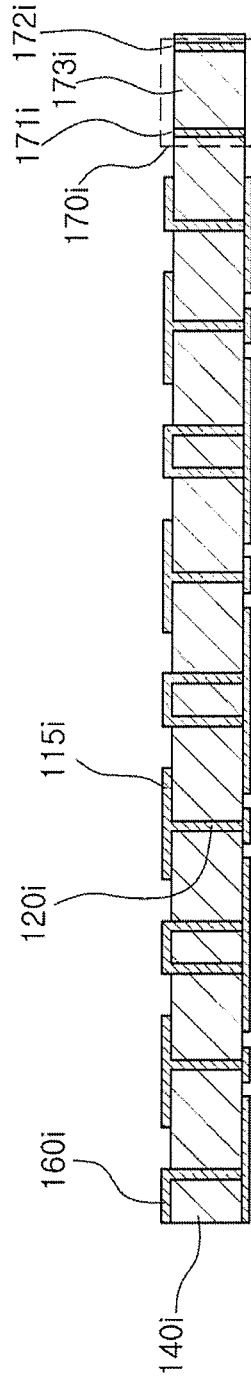

Referring to FIG. 9B, a feed via 120*i* and a plating member 160*i* may be filled in some regions and an antenna member 115*i* may be disposed on an upper surface of the dielectric layer 140*i*.

In addition, first and second electrodes 171*i* and 172*i* may be filled together with the feed via 120*i* and the plating member 160*i*, and a dielectric layer disposed between the first and second electrodes 171*i* and 172*i* may be replaced with a dielectric body 173*i* to form a chip antenna 170*i*.

Figure 9C:
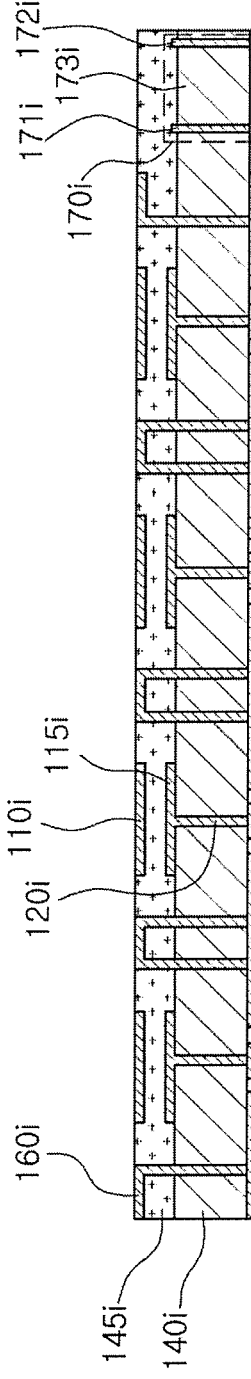

Referring to FIG. 9C, a second dielectric layer 145*i* having the same dielectric constant as that of the dielectric layer 140*i* may be disposed on the upper surface of the dielectric layer 140*i*, and a director member 110*i* may be disposed on an upper surface of the second dielectric layer 145*i*. The second dielectric layer 145*i* may be integrated with the dielectric layer 140*i* to form a single dielectric layer.

Figure 9D:
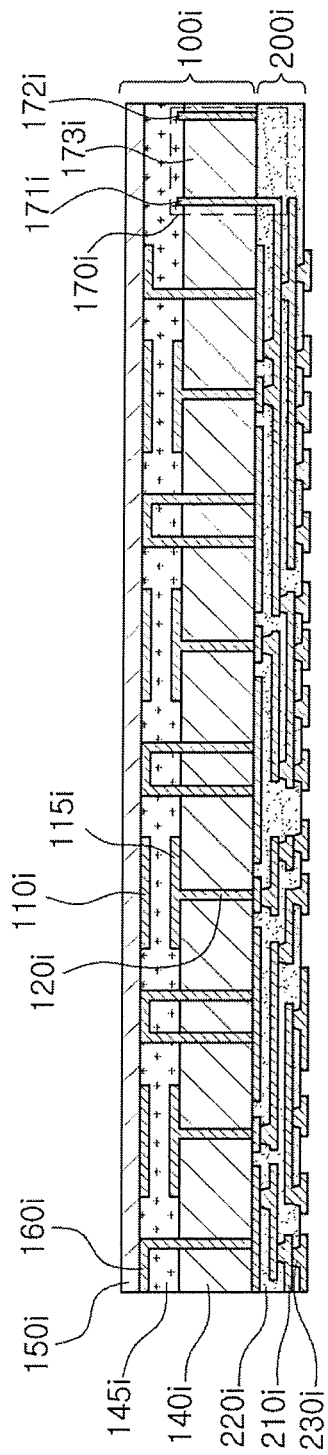

Referring to FIG. 9D, an encapsulation member 150*i* before being cured may be disposed on the upper surface of the second dielectric layer 145*i* and the upper surface of the chip antenna, and may be cured after being disposed on the upper surface of the second dielectric layer 145*i* and the upper surface of the chip antenna.

In addition, a connection member including at least one wiring layer 210i, at least one insulating layer 220i, and a wiring via 230i may be disposed below the dielectric layer 140i.

Figure 9E:
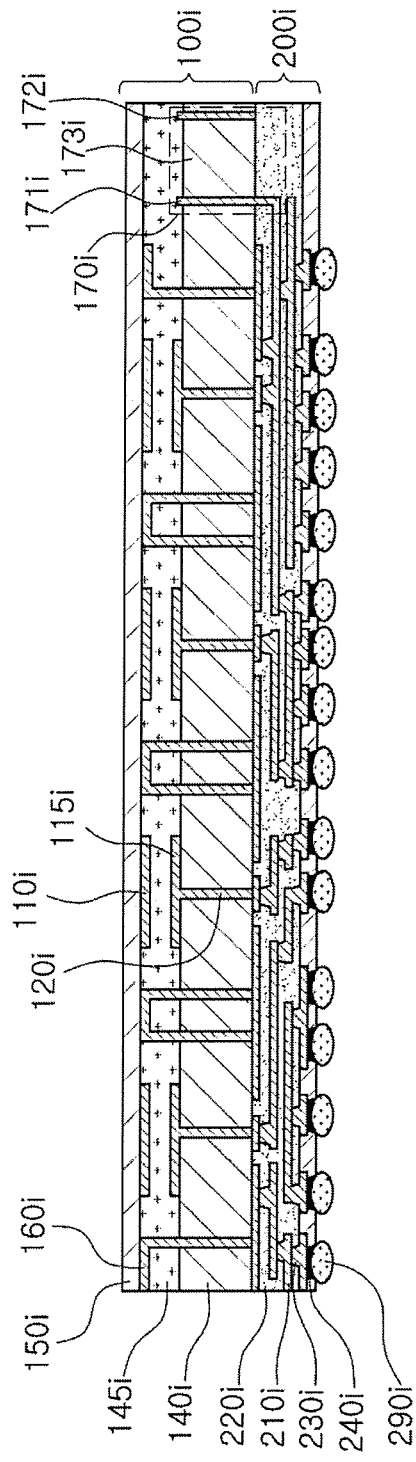

Referring to FIG. 9E, a connection pad 240i, a passivation layer 250i, and an electrical connection structure 290i may be disposed on the connection member. The connection member may be coupled to the IC package through the electrical connection structure 290i.

FIGS. 10A through 10G are views illustrating an example of a third manufacturing method of an antenna module according to an exemplary embodiment in the present disclosure.

Referring to FIG. 10A, a dielectric layer 140j may be provided with some regions removed. A feed via 120j and a plating member 160j may be filled in some regions. An antenna member 115j may be disposed on an upper surface of the dielectric layer 140j and an electrical connection structure 125j may be disposed on a lower surface of the dielectric layer 140j.

In addition, a second dielectric layer 145j having the same dielectric constant as that of the dielectric layer 140j may be disposed on the upper surface of the dielectric layer 140j, and a director member 110j may be disposed on an upper surface of the second dielectric layer 145j. The second dielectric layer 145j may be integrated with the dielectric layer 140j to form a single dielectric layer. An encapsulation member 150j before being cured may be disposed on the upper surface of the second dielectric layer 145j, and may be cured after being disposed on the upper surface of the second dielectric layer 145j.

Referring to FIG. 10B, a connection member including at least one wiring layer 210j, at least one insulating layer 220j, and a wiring via 230j may be disposed below the dielectric layer 140j.

Referring to FIG. 10C, some regions of the connection member and some regions of the antenna package may be removed.

Referring to FIG. 10D, a metal material (e.g., a conductive material such as copper (Cu), aluminum (Al), silver (Ag), tin (Sn), gold (Au), nickel (Ni), lead (Pb), titanium (Ti), or an alloy thereof) may be filled in the removed regions of the connection member and the antenna package as first and second electrodes 171j and 172j.

Referring to FIG. 10E, the first and second electrodes 171j and 172j may be electrically connected to a corresponding wire of at least one wiring layer 210j. Accordingly, the first and second electrodes 171j and 172j may transmit and receive a second RF signal.

Referring to FIG. 10F, a connection pad 240j and a passivation layer 250j may be disposed on the connection member.

Figure 10G:
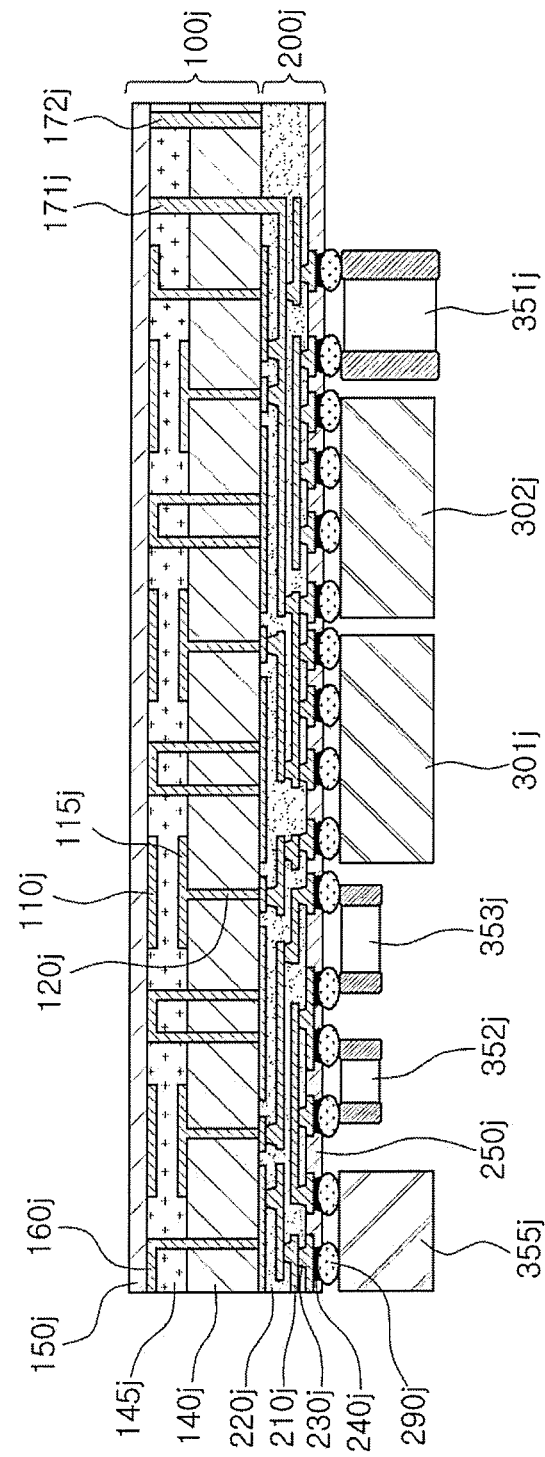

Referring to FIG. 10G, an IC 301j, a PMIC 302j, a plurality of passive components 351j, 352j, and 353j, and a support member 355j may be disposed on a lower surface of the connection member.

Figure 11:
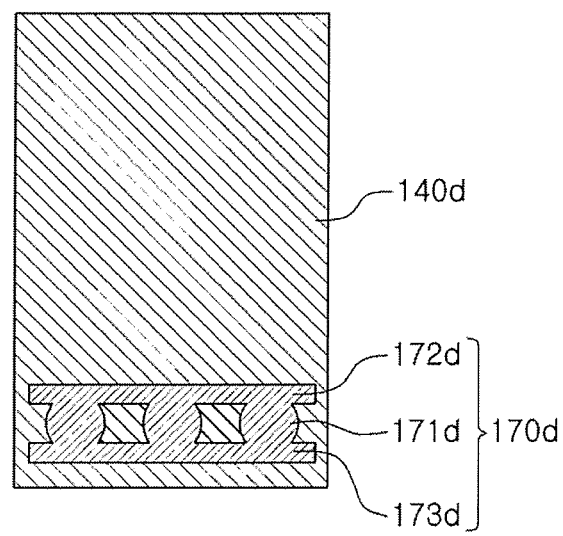
FIG. 11 is a schematic view illustrating a first step of an example of a process of manufacturing a chip antenna according to an exemplary embodiment in the present disclosure.

FIG. 11 is a schematic view illustrating a first step of an example of a process of manufacturing a chip antenna of an antenna module.

Referring to FIG. 11, the chip antenna 170d in the first step may have a form in which a plurality of feed vias 171d and via plated body 172d and 173d are bonded to each other in the dielectric layer 140d.

Figure 12A:
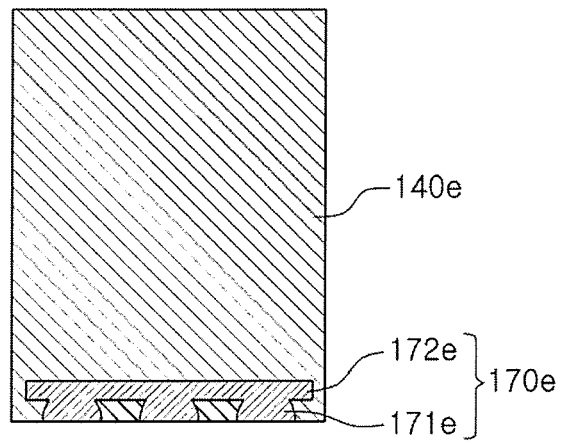
FIGS. 12A and 12B are schematic views illustrating a second step of an example of a process of manufacturing a chip antenna according to an exemplary embodiment in the present disclosure.
Figure 12B:
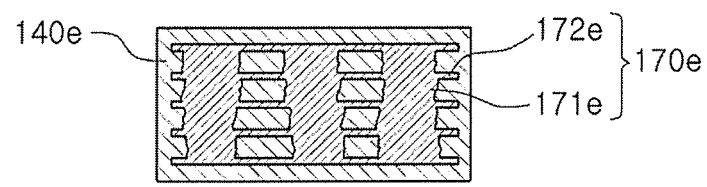

FIG. 12A is a schematic top view illustrating a second step of an example of a process of manufacturing a chip antenna and FIG. 12B is a schematic cross-sectional view illustrating the second step of the process of manufacturing the chip antenna.

Referring to FIGS. 12A and 12B, a chip antenna 170e in the second step may have a form in which cut bodies 171e of a plurality of feed vias and a single via plated body 172e are boned to each other in a dielectric layer 140e.

Figure 13A:
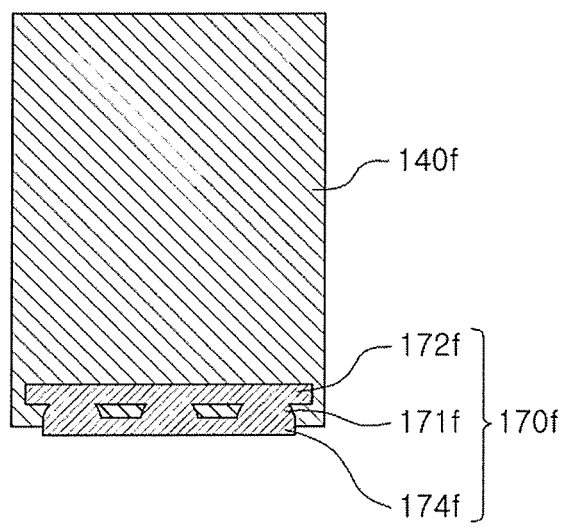
FIGS. 13A and 13B are schematic views illustrating a third step of an example of a process of manufacturing a chip antenna according to an exemplary embodiment in the present disclosure.
Figure 13B:
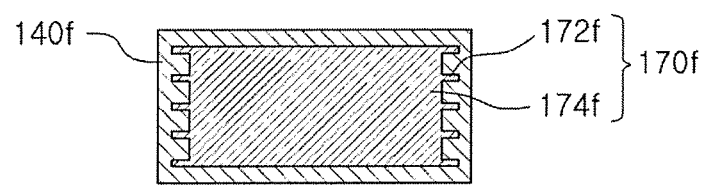

FIG. 13A is a schematic top view illustrating a third step of an example of a process of manufacturing a chip antenna and FIG. 13B is a schematic cross-sectional view illustrating the third step of the process of manufacturing the chip antenna.

Referring to FIGS. 13A and 13B, a chip antenna 170f in the third step may have a form in which cut bodies 171f of a plurality of feed vias and a plurality of via plated bodies 172f and 174f are bonded to each other in a dielectric layer 140f.

Figure 14:
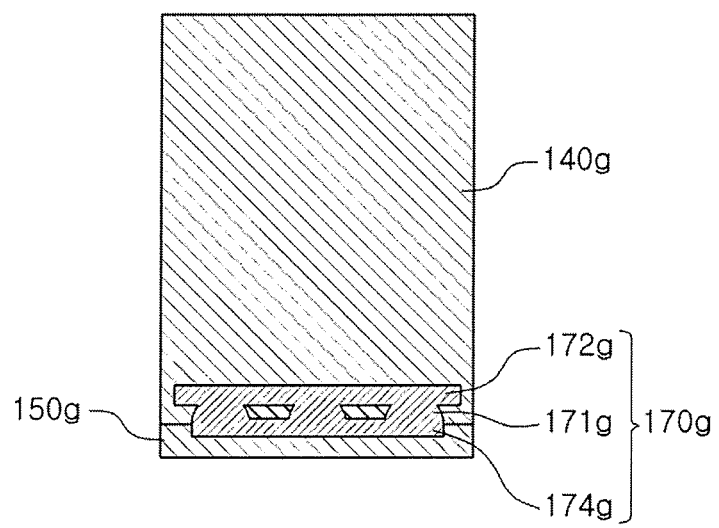
FIG. 14 is a schematic view illustrating a fourth step of an example of a process of manufacturing a chip antenna according to an exemplary embodiment in the present disclosure.

FIG. 14 is a schematic view illustrating a fourth step of an example of a process of manufacturing an antenna package.

Referring to FIG. 14, a chip antenna 170g in the fourth step may have a form in which cut bodies 172g of a plurality of feed vias and a plurality of via plated bodies 172g and 174g are bonded to each other in a dielectric layer 140g and may be in contact with a second encapsulation member 150g.

Figure 15:
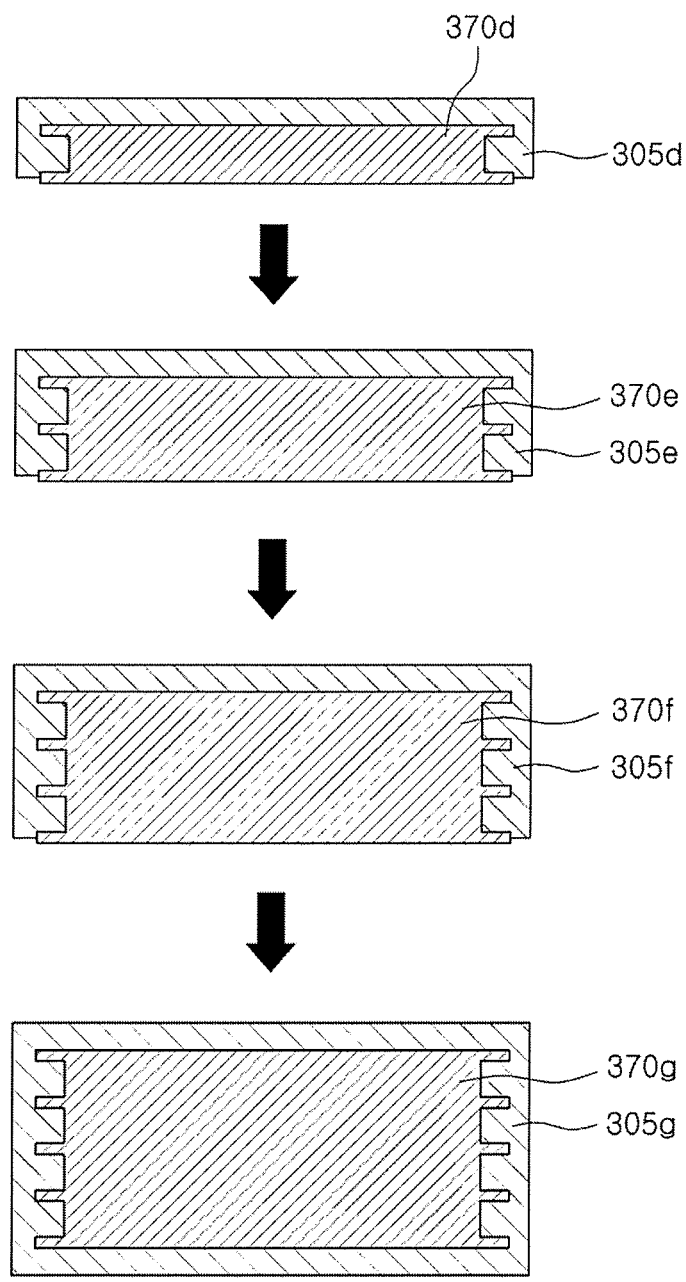
FIG. 15 is a schematic view illustrating another example of a process of manufacturing a chip antenna according to an exemplary embodiment in the present disclosure.

FIG. 15 is a schematic view illustrating another example of a process of manufacturing a chip antenna.

Referring to FIG. 15, the chip antennas 170d, 170e, 170f, and 170g may be formed together with encapsulation members 305d, 305e, 305f, and 305g in a way in which a plurality of feed vias and a plurality of layers are alternately stacked.

FIGS. 16A through 16G is schematic views illustrating first to seventh steps of an example of a process of manufacturing an IC package.

Referring to FIG. 16A, a support member 355h having a core via 360 inserted thereinto and an accommodating space of a passive component 350h may be compressed to a film 380h. The core via 360h may be formed of a conductive material such as copper (Cu), aluminum (Al), silver (Ag), tin (Sn), gold (Au), nickel (Ni), lead (Pb), titanium (Ti), or an alloy thereof.

Referring to FIG. 16B, a core dielectric layer 356h may be disposed on each of the opposite surfaces of the support member 355h, and a core wiring layer 359h may be connected to each of the opposite ends of the core via 360h.

Figure 16C:
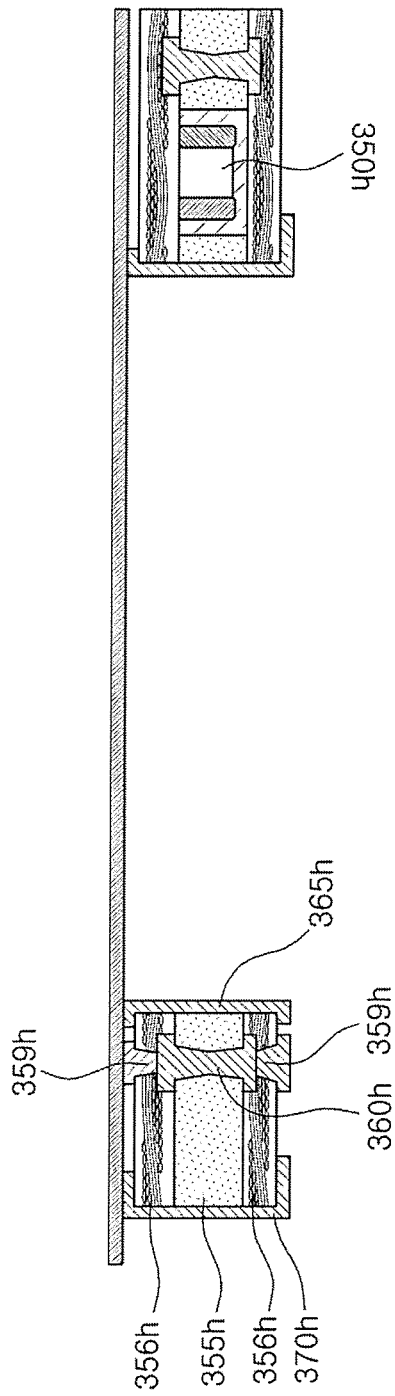
FIG. 16C is a schematic view illustrating a third step of an example of a process of manufacturing an IC package according to an exemplary embodiment in the present disclosure.

Referring to FIG. 16C, portions of the support member 355h and the core dielectric layer 356h may be etched, and core plating members 365h and 370h may be formed on the etched surfaces of the support member 355h and the core dielectric layer 356h by a plating method. The film 380h may be then removed.

Figure 16D:
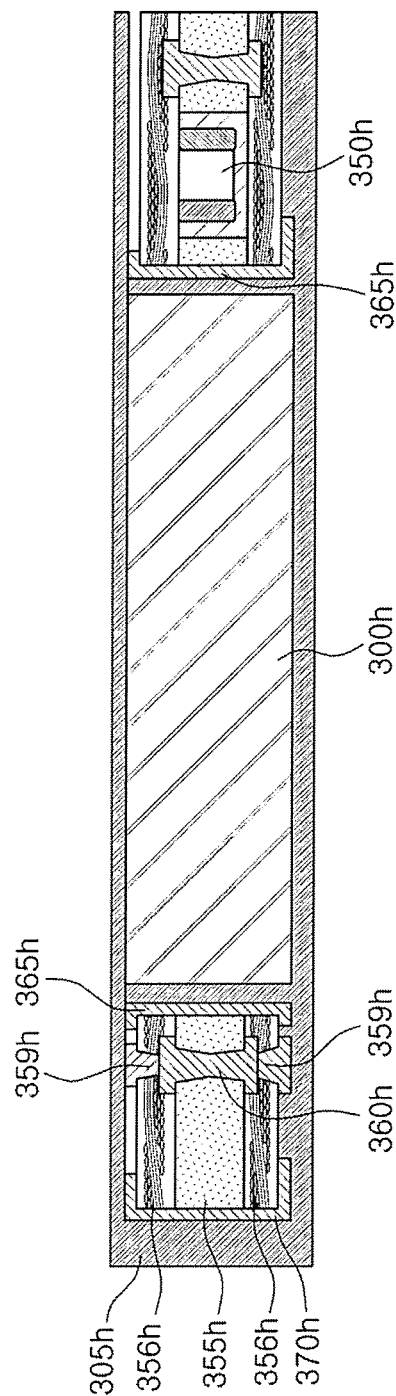
FIG. 16D is a schematic view illustrating a fourth step of an example of a process of manufacturing an IC package according to an exemplary embodiment in the present disclosure.

Referring to FIG. 16D, an IC 300h may be disposed on the etched portions of the support member 355h and the core dielectric layer 356h, and an encapsulant 305h may encapsulate at least a portion of the IC 300h. The IC package in the fourth step may be rotated in a process of performing a fifth step.

Figure 16E:
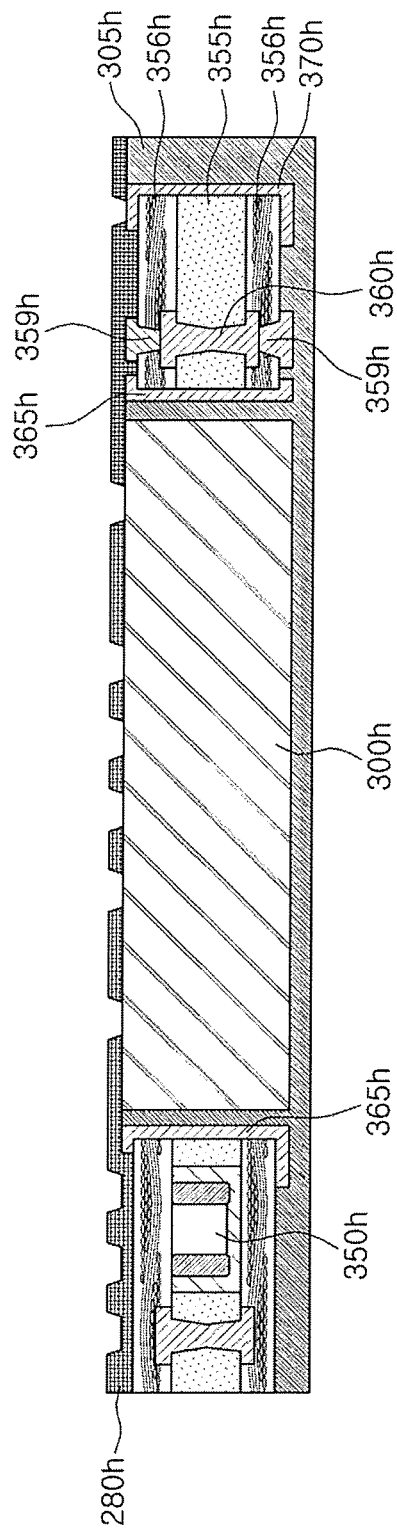
FIG. 16E is a schematic view illustrating a fifth step of an example of a process of manufacturing an IC package according to an exemplary embodiment in the present disclosure.

Referring to FIG. 16E, an insulating layer 280h may be disposed on the IC 300h and the support member 355h.

Figure 16F:
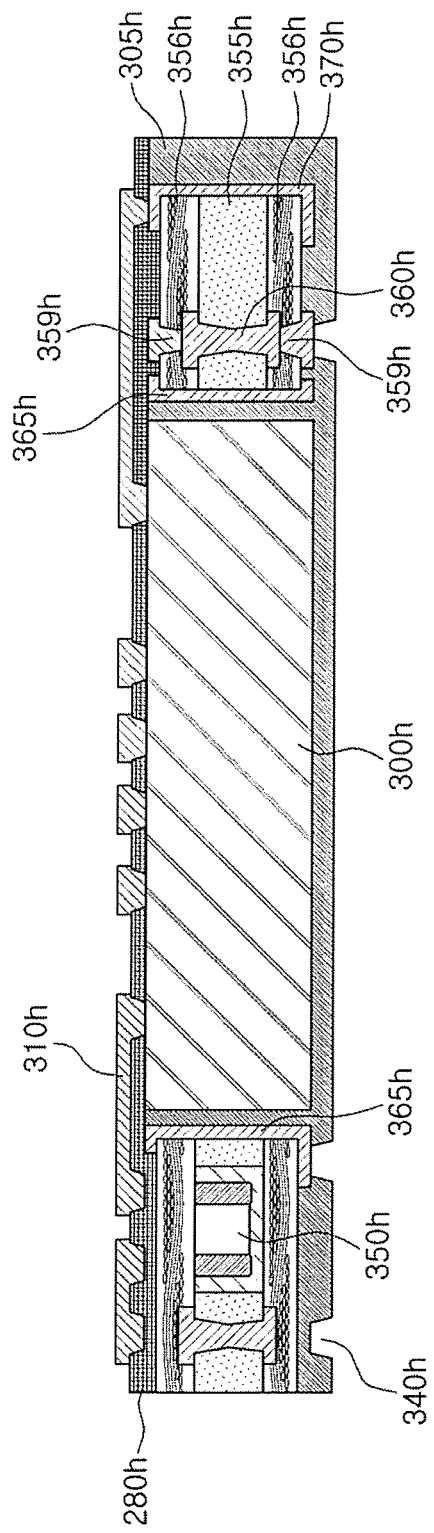
FIG. 16F is a schematic view illustrating a sixth step of an example of a process of manufacturing an IC package according to an exemplary embodiment in the present disclosure.

Referring to FIG. 16F, at least one wiring layer 310h may be disposed on the support member 355h to electrically connect the core via 360h and/or the core plating members 365h and 370h to the IC 300h, and may be formed of a conductive material such as copper (Cu), aluminum (Al), silver (Ag), tin (Sn), gold (Au), nickel (Ni), lead (Pb), titanium (Ti), or an alloy thereof.

Figure 16G:
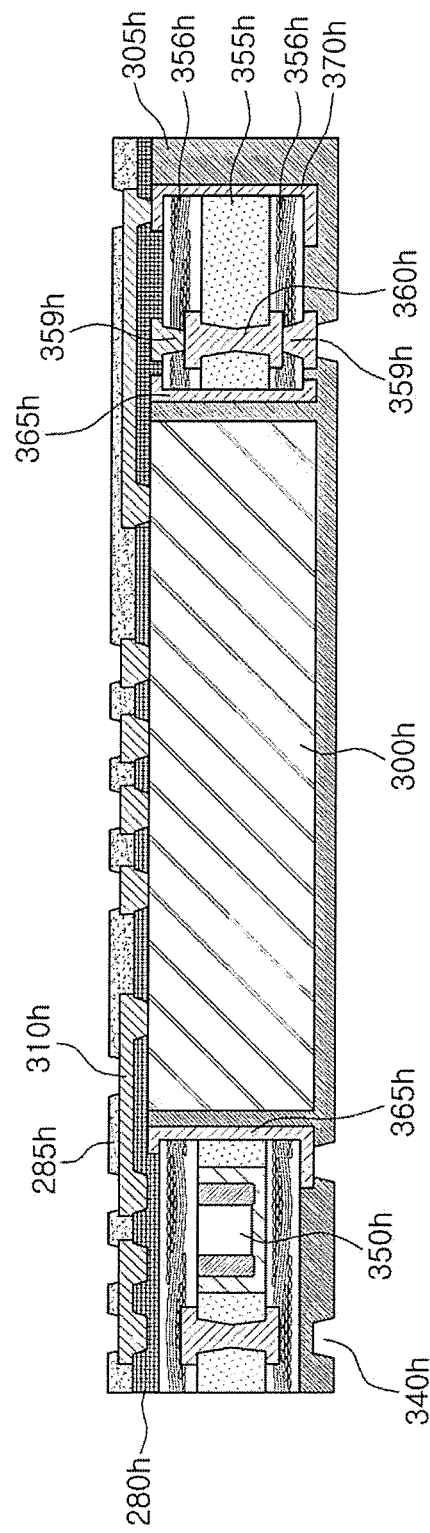
FIG. 16G is a schematic view illustrating a seventh step of an example of a process of manufacturing an IC package according to an exemplary embodiment in the present disclosure.

Referring to FIG. 16G, a passivation layer 285h may have a layout space of the connection pad or the electrical connection structure and may be disposed on at least one wiring layer 310h.

Figure 17:
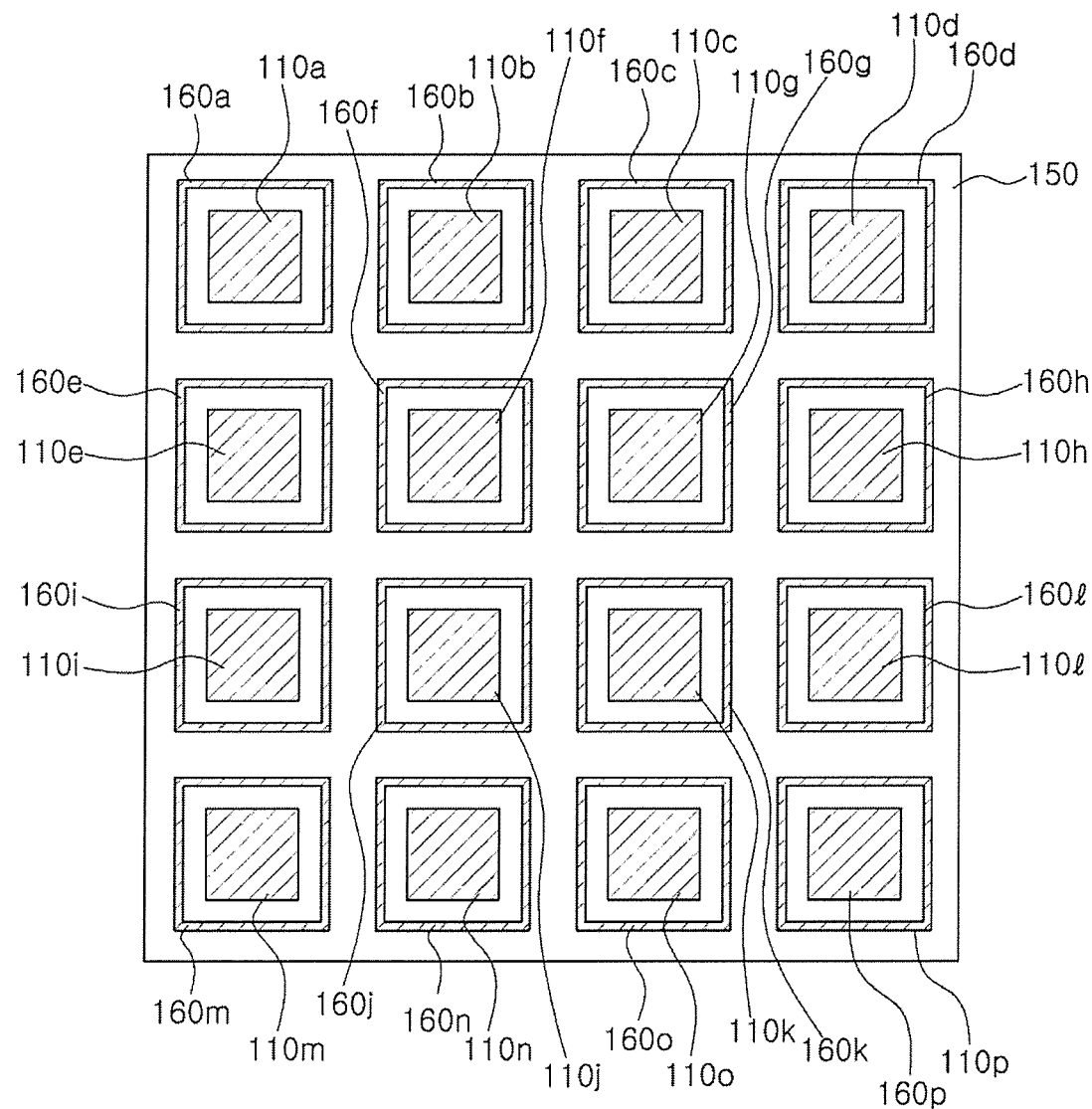
FIG. 17 is a schematic view illustrating an upper surface of an example of an antenna module according to an exemplary embodiment in the present disclosure.

FIG. 17 is a schematic view illustrating an upper surface of an example of an antenna module according to an exemplary embodiment in the present disclosure.

Referring to FIG. 17, each of a plurality of director members 110a, 110b, 110c, 110d, 110e, 110f, 110g, 110h, 110i, 110j, 110k, 110l, 110m, 110n, 110o, and 110p may have a form of a patch antenna and may be surrounded by a corresponding plating member of a plurality of plating members 160a, 160b, 160c, 160d, 160e, 160f, 160g, 160h, 160i, 160j, 160k, 160l, 160m, 160n, 160o, and 160p. If the antenna module does not include the plurality of director members, the plurality of director members 110a, 110b, 110c, 110d, 110e, 110f, 110g, 110h, 110i, 110j, 110k, 110l, 110m, 110n, 110o, and 110p may be replaced with a plurality of antenna members.

Figure 18:
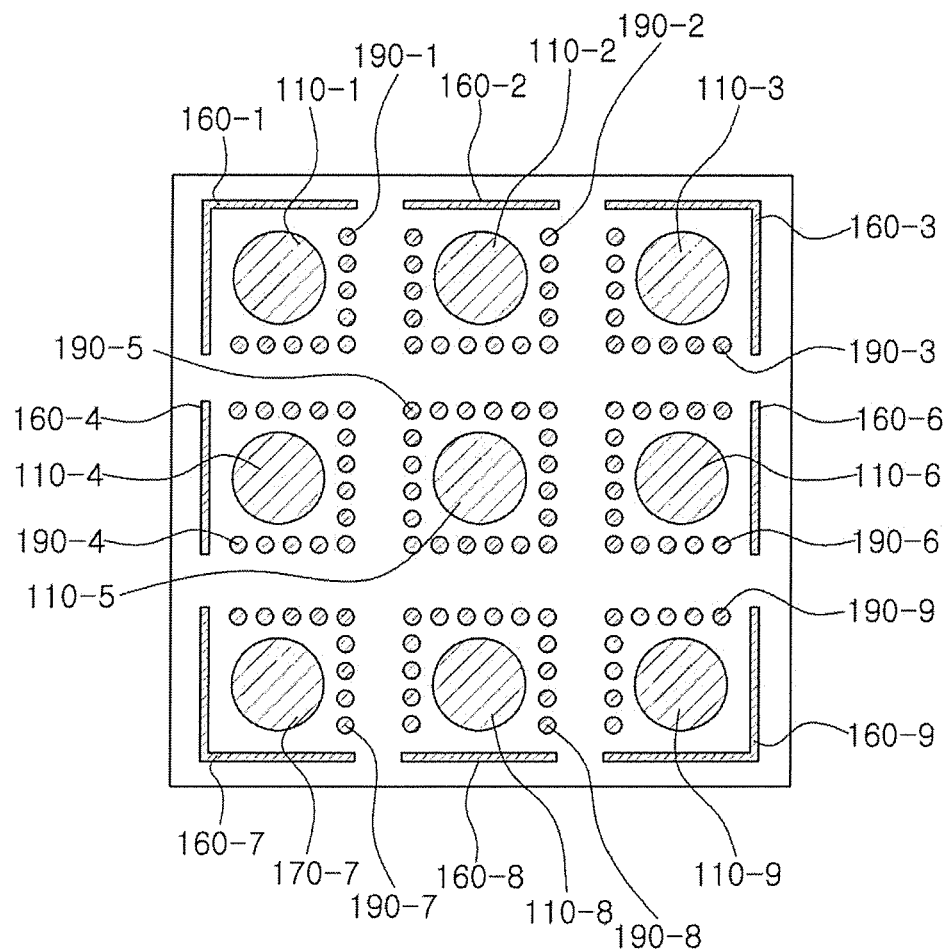
FIG. 18 is a schematic view illustrating an upper surface of another example of an antenna module according to an exemplary embodiment in the present disclosure.

FIG. 18 is a schematic view illustrating an upper surface of another example of an antenna module according to an exemplary embodiment in the present disclosure.

Referring to FIG. 18, each of a plurality of director members 110-1, 110-2, 110-3, 110-4, 110-5, 110-6, 110-7, 110-8, and 110-9 may be surrounded by at least one of corresponding plating members 160-1, 160-2, 160-3, 160-4, 160-5, 160-6, 160-7, 160-8, and 160-9, and a plurality of shielding vias 190-1, 190-2, 190-3, 190-4, 190-5, 190-6, 190-7, 190-8, and 190-9. If the antenna module does not include the plurality of director members, the plurality of director members 110-1, 110-2, 110-3, 110-4, 110-5, 110-6, 110-7, 110-8, and 110-9 may be replaced with a plurality of antenna members.

Meanwhile, the number, layout, and shape of the plurality of director members or the plurality of antenna members illustrated in FIGS. 17 and 18 are not particularly limited. For example, the shape of the plurality of director members illustrated in FIG. 17 may be circle, and the number of the plurality of antenna members illustrated in FIG. 18 may be four.

Figure 19A:
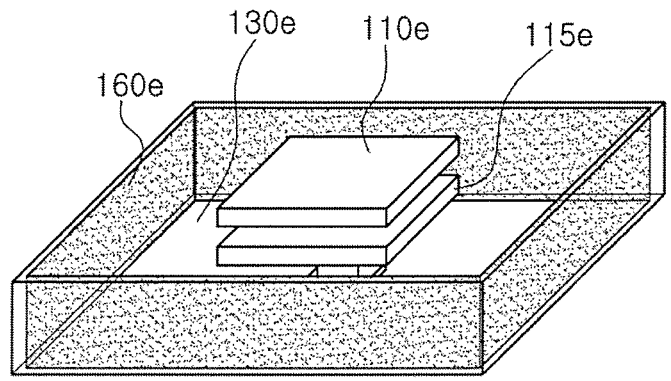
FIGS. 19A through 19C are perspective views each illustrating an example of a cavity of an antenna package according to an exemplary embodiment in the present disclosure.
Figure 19B:
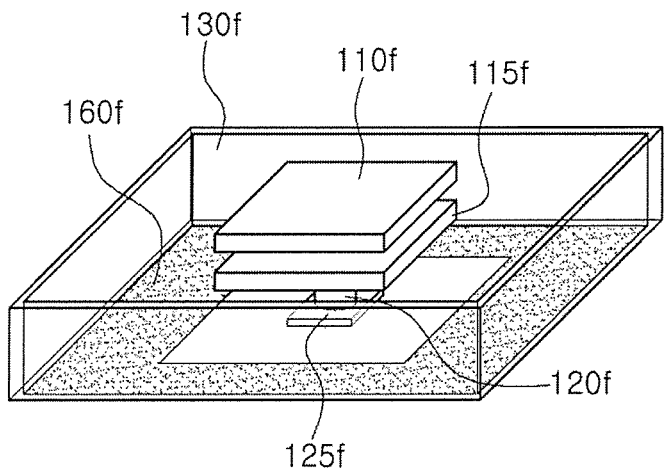
Figure 19C:
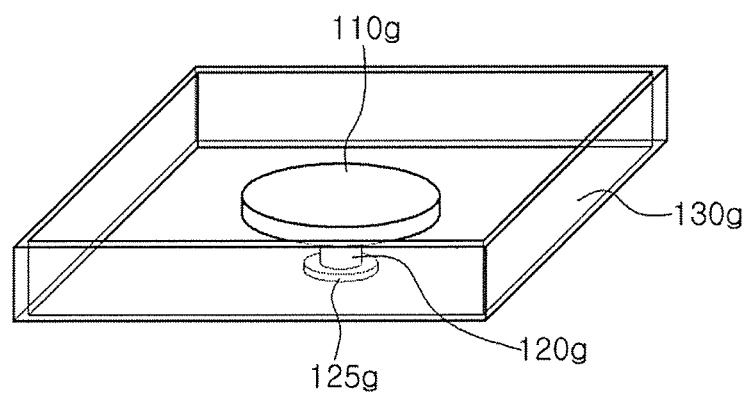

FIGS. 19A through 19C are perspective views each illustrating an example of a cavity of an antenna package according to an exemplary embodiment in the present disclosure.

Referring to FIG. 19A, a cavity may include at least portions of a director member 110e, an antenna member 115e, a feed via, an electrical connection structure, a dielectric layer 130e, and a plating member 160e. Here, the plating member 160e may be disposed to surround side surfaces of the cavity. That is, a lower surface of the cavity may be covered by a ground pattern disposed on an upper surface of the connection member.

Referring to FIG. 19B, the cavity may include at least portions of a director member 110f, an antenna member 115f, a feed via 120f, an electrical connection structure 125f, a dielectric layer 130f, and a plating member 160f. Here, the plating member 160f may be disposed to cover a portion of the lower surface of the cavity. That is, the side surfaces of the cavity may be surrounded by the plating member disposed on side surfaces of an insulating member on the connection member. Accordingly, isolation between the connection member and the IC of the antenna package may be improved.

Referring to FIG. 19C, the cavity may include at least portions of an antenna member 110g, a feed via 120g, an electrical connection structure 125g, and a dielectric layer 130g. That is, the side surfaces of the cavity may be surrounded by the plating member disposed on the side surfaces of the insulating member on the connection member, and the lower surface of the cavity may be covered by the ground pattern disposed on the upper surface of the connection member.

Meanwhile, the electrical connection structures 125f and 125g may be connected to a corresponding wire of at least one wiring layer 210 of the connection member when the antenna package and the connection member are coupled to each other. For example, the electrical connection structures 125f and 125g may be implemented in electrodes, pins, solder balls, lands, and the like.

Meanwhile, the IC package disclosed herein may be implemented according to a fan-out semiconductor package to be described below. To facilitate understanding of the fan-out semiconductor package, a description will be made with reference to FIGS. 20 through 27.

Figure 20:
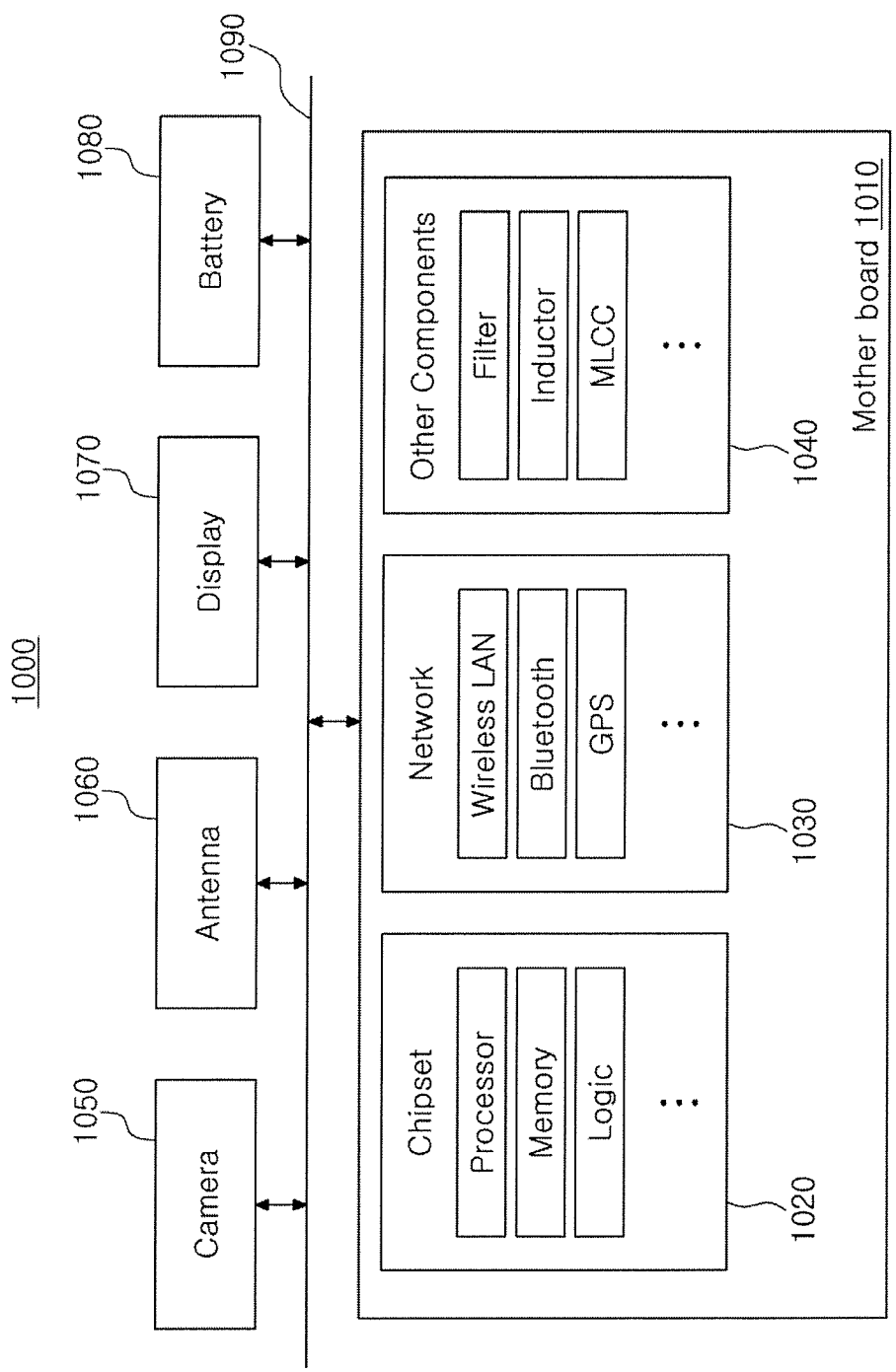
FIG. 20 is a schematic block diagram illustrating an example of an electronic device system.

FIG. 20 is a block diagram schematically illustrating an example of an electronic device system.

Referring to FIG. 20, an electronic device 1000 accommodates a main board (or mother substrate) 1010. The main board 1010 is physically and/or electrically connected to a chip-related component 1020, a network-related component 1030, and other component 1040. The components are also combined with any other electronic component (to be described later) to form various signal lines 1090.

The chip-related component 1020 includes a memory chip such as a volatile memory (e.g., a DRAM), a non-volatile memory (e.g., a ROM), a flash memory, and the like, an application processor chip such as a central processor (e.g., a CPU), a graphics processor (e.g., GPU), a digital signal processor, a cryptographic processor, a microprocessor, a micro-controller, and the like, a logic chip such as an analog-to-digital converter, an application-specific IC (ASIC), and the like, but the chip-related component 1020 is not limited thereto and may include any other types of chip-related electronic component. Also, these electronic components 1020 may be combined with each other.

The network-related component 1030 may include Wi-Fi (IEEE 802.11 family, etc.), WiMAX (IEEE 802.16 family, etc.), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, 5G, and any other wireless and wired protocols designated thereafter. However, the network-related component 1030 is not limited thereto and any other among a plurality of wireless or wired standards or protocols. Also, the network-related component 1030 may be combined with the chip-related electronic component 1020.

The other component 1040 includes a high-frequency inductor, a ferrite inductor, a power inductor, a ferrite bead, a Low Temperature Co-Fired Ceramic (LTCC), an Electro Magnetic Interference (EMI) filter, a Multilayer Ceramic Condenser (MLCC), and the like, but is not limited thereto and may include passive components used for various other purposes. It is also to be understood that other components 1040 may be combined with each other in conjunction with the chip-related electronic component 1020 and/or the network-related electronic component 1030.

According to types of electronic device 1000, the electronic device 1000 may include other electronic components that may or may not be physically and/or electrically connected to the main board 1010. The other electronic components include, for example, a camera 1050, an antenna 1060, a display 1070, a battery 1080, an audio codec (not shown), a video codec (not shown), a power amplifier (not shown), a compass (not shown), an accelerometer (not shown), a gyroscope (not shown), a speaker (not shown), a mass storage device (e.g., a hard disk drive) (not shown), a compact disk (CD) (not shown), a digital versatile disk (DVD) (not shown), and the like. However, the other electronic components are not limited thereto and may include other electronic components used for various purposes according to types of the electronic device 1000.

The electronic device 1000 may be a smart phone, a personal digital assistant (PDA), a digital video camera, a digital still camera, a network system, a computer, a monitor, a tablet, a laptop, a netbook, a television, a video game, a smart watch, an automotive, and the like. However, the electronic device 1000 is not limited thereto and may be any other electronic device that processes data.

Figure 21:
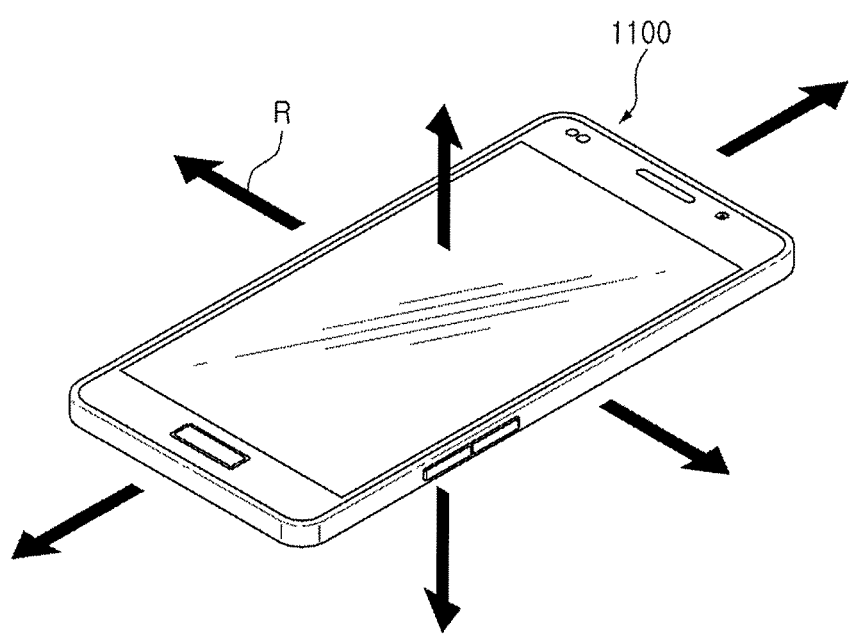
FIG. 21 is a schematic perspective view illustrating an example of an electronic device.

FIG. 21 is a perspective view schematically illustrating an example of an electronic device.

Referring to FIG. 21, the electronic device may be, for example, a smartphone 1100. A radio frequency integrated circuit (RF IC) may be applied in the form of a semiconductor package to the smartphone 1100, and an antenna may be applied in the form of a substrate or a module. As the RF IC and an antenna are electrically connected in the smartphone 1100, an antenna signal may be radiated (R) in various directions. The semiconductor package including the RF IC and the substrate or module including the antenna may be applied in various forms to an electronic device such as a smartphone, or the like.

Generally, a semiconductor chip has many microelectronic circuits integrated therein, but the semiconductor chip itself may not serve as a finished semiconductor product and has a possibility of being damaged by an external physical or chemical impact. Therefore, the semiconductor chip itself is not used as is but is packaged so that the semiconductor chip in a package state is used in an electronic device.

The reason that the semiconductor packaging is required, is because there is a difference in circuit width between the semiconductor chip and the main board of the electronic device from the viewpoint of electrical connection. Specifically, in the case of the semiconductor chip, sizes of the connection pads and a spacing between the connection pads are very small. Meanwhile, in the case of a main board used in an electronic device, a size of an electronic component mounting pad and a spacing between the electronic component mounting pads are much bigger than a scale of the semiconductor chip. Therefore, it may be difficult to directly mount the semiconductor chip on such a main board, and a packaging technique which may buffer the difference in circuit width therebetween is required.

The semiconductor package manufactured by such a packaging technique may be classified as a fan-in semiconductor package and a fan-out semiconductor package according structures and purposes.

Hereinafter, the fan-in semiconductor package and the fan-out semiconductor package will be described in detail with reference to the accompanying drawings.

Figure 22:
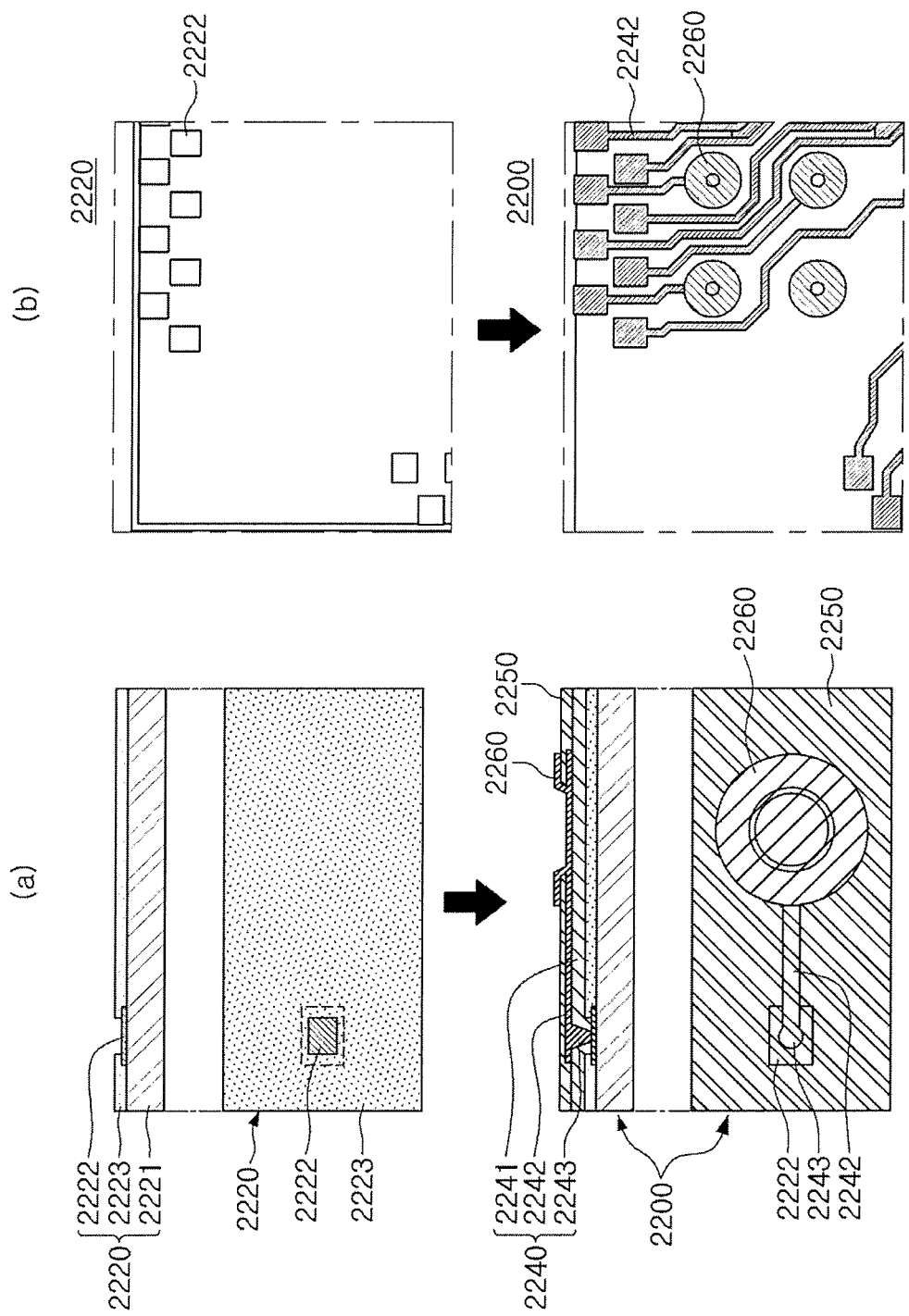
FIG. 22 is a schematic cross-sectional view illustrating states of a fan-in semiconductor package before and after being packaged.

FIG. 22 is a cross-sectional view schematically illustrating states before and after packaging a fan-in semiconductor package.

Figure 23:
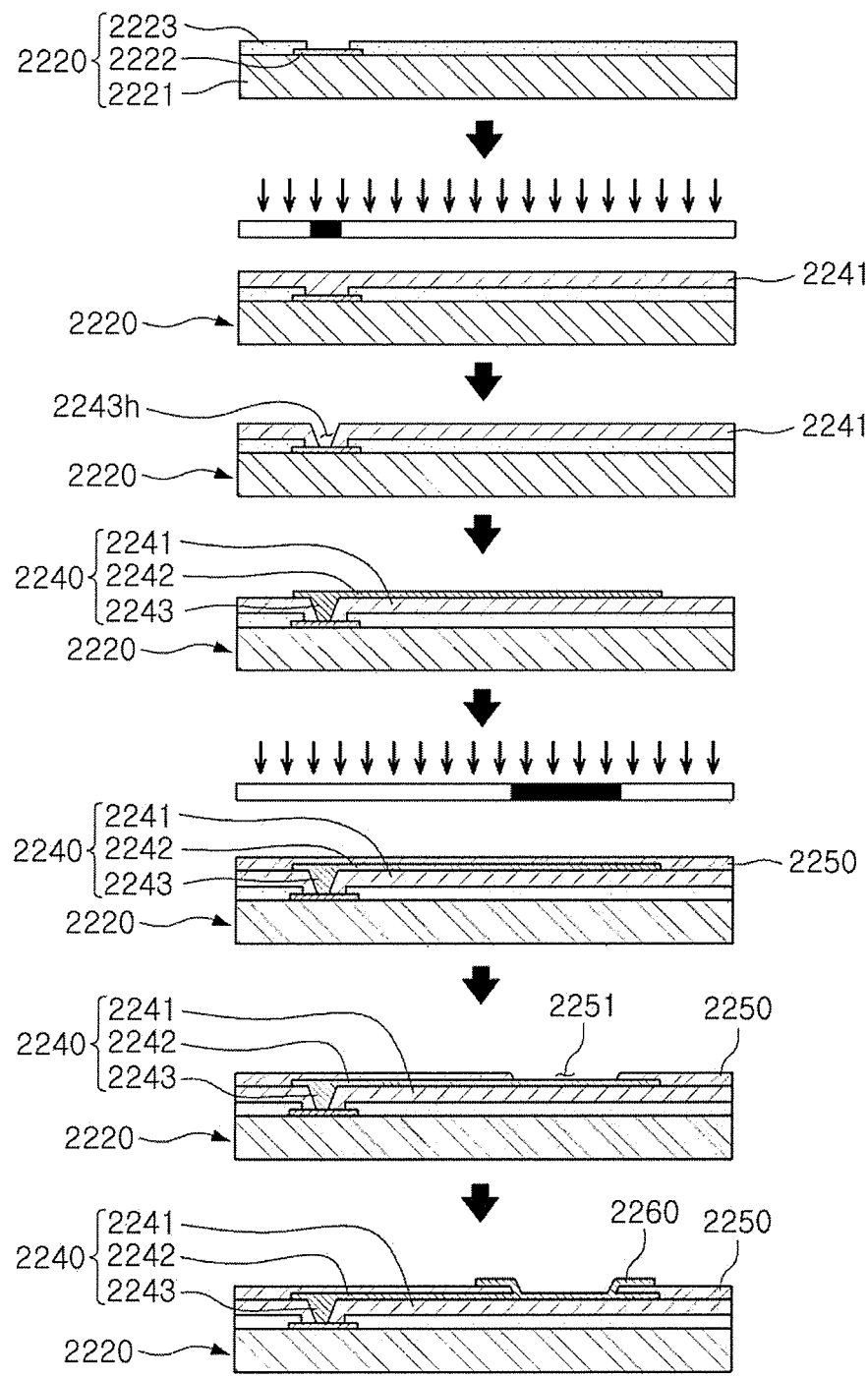
FIG. 23 is schematic cross-sectional views illustrating a packaging process of a fan-in semiconductor package.

FIG. 23 is a cross-sectional view schematically illustrating a packaging process of a fan-in semiconductor package.

Referring to FIGS. 22 and 23, a semiconductor chip 2220 may be, for example, a bare integrated circuit (IC) including a body 2221 including silicon (Si), germanium (Ge), a gallium arsenide (GaAs), and the like, a connection pad 2222 formed on one surface of the body 2221 and including a conductive material such as aluminum (Al), or the like, and a passivation film 2223 such as an oxide film or a nitride film formed on one surface of the body 2221 and covering at least a portion of the connection pads 2222. Here, since the connection pad 2222 is very small, it is difficult for the IC to be mounted even on a medium-level PCB, let alone a main board of an electronic device, and the like.

In order to rewire the connection pad 2222, a connection member 2240 is formed on the semiconductor chip 2220 according to a size of the semiconductor chip 2220. The connection member 2240 may be formed by forming an insulating layer 2241 with an insulating material such as a photosensitive insulating resin (PID) on the semiconductor chip 2220, forming a via hole 2243*h* opening the connection pad 2222, and subsequently forming a wiring pattern 2242 and a via 2243. Thereafter, a passivation layer 2250 for protecting the connection member 2240 is formed, an opening 2251 is formed, and an underbump metallization layer 2260, or the like, is subsequently formed. That is, through a series of processes, a fan-in semiconductor package 2200 including, for example, the semiconductor chip 2220, the connection member 2240, the passivation layer 2250, and the underbump metallization layer 2260 is manufactured.

As described above, the fan-in semiconductor package may be in the form of a package in which the connection pads of the semiconductor chip, for example, input/output (I/O) terminals are all disposed inside the device, may have good electrical properties, and may be produced at low cost. Accordingly, many devices to be disposed in a smartphone are manufactured in the form of the fan-in semiconductor package and development is being made toward realization of a small size and fast signal transmission.

However, in the fan-in semiconductor package, all of the I/O terminals must be disposed inside the semiconductor chip, so that there are many space limitations. Therefore, such a structure is difficult to apply to a semiconductor chip having a large number of I/O terminals or a semiconductor chip having a small size. In addition, due to the vulnerability, the fan-in semiconductor package may not be directly mounted on a main board of an electronic device. Although the size and spacing of the I/O terminals of the semiconductor chip are enlarged by a rewiring process, the I/O terminals may not have a size and spacing enough to be directly mounted on the main board of the electronic device.

Figure 24:
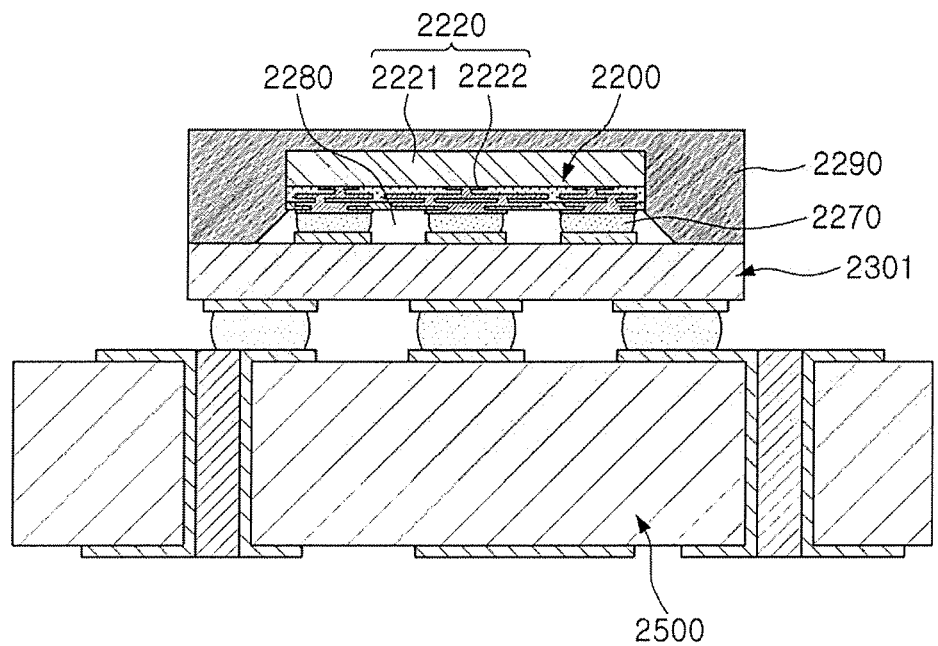
FIG. 24 is a schematic cross-sectional view illustrating a case in which a fan-in semiconductor package is mounted on an interposer substrate and is finally mounted on a main board of an electronic device.

FIG. 24 is a cross-sectional view schematically illustrating a case where a fan-in semiconductor package is mounted on an interposer substrate and ultimately mounted on a main board of an electronic device.

Figure 25:
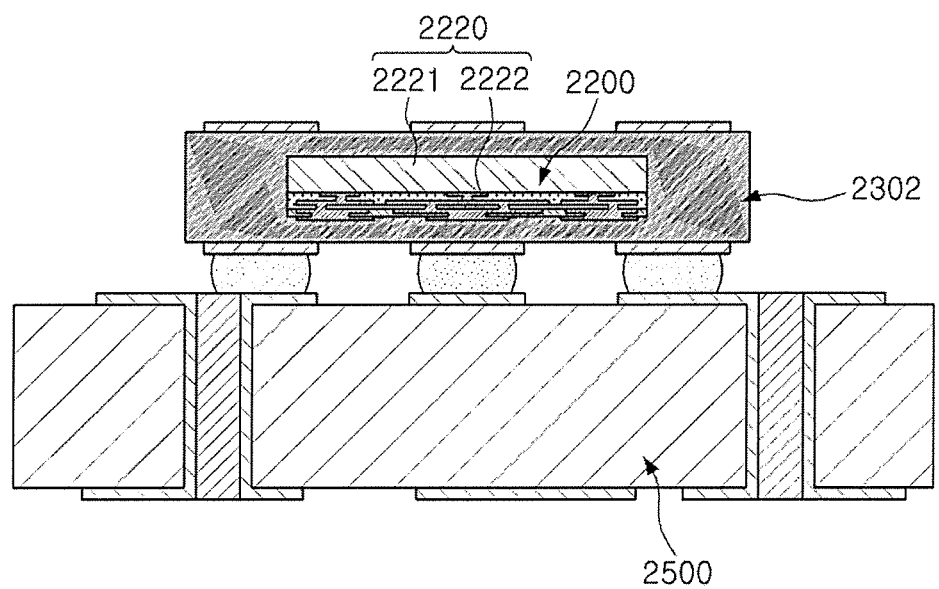
FIG. 25 is a schematic cross-sectional view illustrating a case in which a fan-in semiconductor package is embedded in an interposer substrate and is finally mounted on a main board of an electronic device.

FIG. 25 is a cross-sectional view schematically illustrating a case where a fan-in semiconductor package is embedded in an interposer substrate and ultimately mounted on a main board of an electronic device.

Referring to FIGS. 19 and 20, the connection pads 2222, that is, the I/O terminals, of the semiconductor chip 2220 of the fan-in semiconductor package 2200 are re-wired again through an interposer substrate 2301 and the fan-in semiconductor package 2200 mounted on the interposer substrate 2301 may ultimately be mounted on a main board 2500 of an electronic device. Here, the electrical connection structure 2270, and the like, may be fixed by an underfill resin 2280, and the like, and the outer side may be covered with a molding material 2290, or the like. Alternatively, the fan-in semiconductor package 2200 may be embedded in a separate interposer substrate 2302, the connection pads 2222, i.e., the I/O terminals, of the semiconductor chip 2220 may be re-wired again by the interposer substrate 2302 in the embedded state, and the fan-in semiconductor package 2200 may ultimately be mounted on the main board 2500 of the electronic device.

In this manner, since the fan-in semiconductor package is difficult to be directly mounted on the main board of the electronic device, the fan-in semiconductor package may be mounted on the separate interposer substrate and then mounted on the main board of the electronic device through a packaging process again or may be embedded in the interposer substrate and mounted on the main board of the electronic device.

Figure 26:
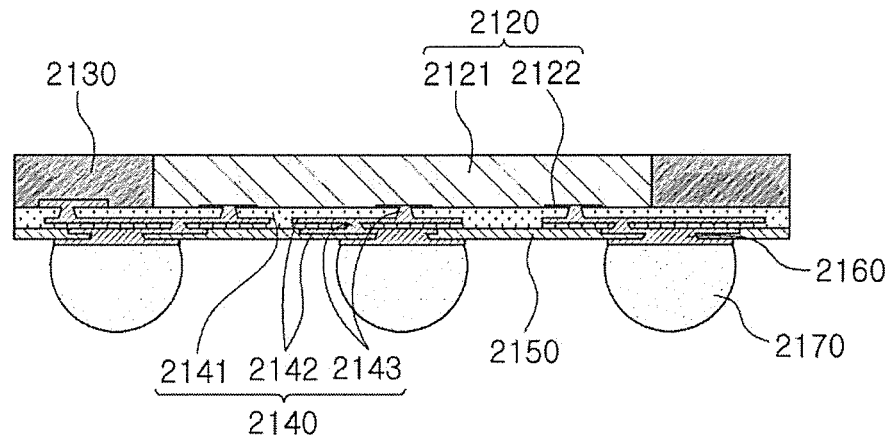
FIG. 26 is a schematic cross-sectional view illustrating a fan-out semiconductor package.

FIG. 26 is a cross-sectional view illustrating a schematic view of a fan-out semiconductor package.

Referring to FIG. 21, in the fan-out semiconductor package 2100, for example, the outer side of a semiconductor chip 2120 is protected by an encapsulant 2130, and the connection pads 2122 of the semiconductor chip 2120 are re-wired to the outer side of the semiconductor chip 2120 by the connection member 2140. Here, a passivation layer 2150 may further be formed on the connection member 2140, and an underbump metallization layer 2160 may further be formed in an opening of the passivation layer 2150. An electrical connection structure 2107 may further be formed on an underbump metallization layer 2160. The semiconductor chip 2120 may be an IC including a body 2121, a connection pad 2122, a passivation film (not shown), and the like. The connection member 2140 may include an insulating layer 2141, a re-wiring layer 2142 formed on the insulating layer 2241, and a via 2143 electrically connecting the connection pad 2122 and the re-wiring layer 2142.

As described above, the fan-out semiconductor package is in a form that the I/O terminals are re-wired and disposed even on the outer side of the semiconductor chip through the connection member formed on the semiconductor chip. As described above, in the fan-in semiconductor package, all the I/O terminals of the semiconductor chip must be disposed inside the semiconductor chip, and thus, if a device size is reduced, a ball size and pitch must be reduced, and as a result, a standardized ball layout may not be used. In contrast, in the fan-out semiconductor package, since the I/O terminals are re-wired and disposed even on the outer side of the semiconductor chip through the connection member formed on the semiconductor chip, although the size of the semiconductor chip is reduced, the standardized ball layout may be used as is. Therefore, the fan-out semiconductor package may be mounted on a main board of an electronic device even without a separate interposer substrate as described hereinafter.

Figure 27:
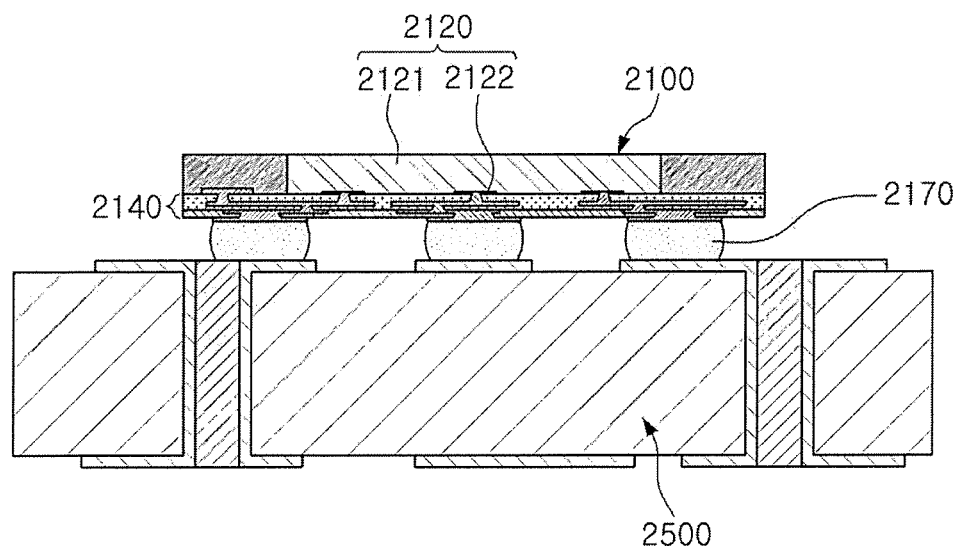
FIG. 27 is a schematic cross-sectional view illustrating a case in which a fan-out semiconductor package is mounted on a main board of an electronic device.

FIG. 27 is a cross-sectional view schematically illustrating a case where a fan-out semiconductor package is mounted on a main board of an electronic device.

Referring to FIG. 27, the fan-out semiconductor package 2100 may be mounted on the main board 2500 of the electronic device through the electrical connection structure 2170, and the like. That is, as described above, the fan-out semiconductor package 2100 may include the connection member 2140 which may re-wire the connection pad 2122 to a fan-out area beyond the size of the semiconductor chip 2120, on the semiconductor chip 2120, the standardized ball layout may be used as is, and as a result, the fan-out semiconductor package 2100 may be mounted on the main board 2500 of the electronic device even without a separate interposer substrate, or the like.

In this manner, since the fan-out semiconductor package may be mounted on the main board of the electronic device even without a separate interposer substrate, a thickness of the fan-out semiconductor package may be smaller than that of the fan-in semiconductor package using an interposer substrate, achieving a small size and a small thickness. In addition, since the fan-out semiconductor package has excellent thermal properties and electrical properties, it is particularly suitable for mobile products. In addition, the fan-out semiconductor package may be realized to be more compact than a general package-on-package (POP) type using a PCB and solve a problem caused due to a bowing phenomenon.

Meanwhile, the fan-out semiconductor package refers to a package technology for mounting a semiconductor chip on a main board of an electronic device and for protecting the semiconductor chip from an external impact and has a concept different from a PCB such as an interposer substrate which are different in scale, purpose, and the like, and having a fan-in semiconductor package embedded therein.

As set forth above, according to an exemplary embodiment in the present disclosure, the antenna module may improve transmission and reception performance of a radio frequency (RF) signal in a first direction, be easily miniaturized, and improve the transmission and reception performance of the RF signal in a second direction by using an antenna package providing an environment capable of easily securing antenna performance.

While exemplary embodiments have been shown and described above, it will be apparent to those skilled in the art that modifications and variations could be made without departing from the scope of the present invention as defined by the appended claims.

What is claimed is:

1. An antenna module comprising:
   a connection member including at least one wiring layer and at least one insulating layer;
   an integrated circuit (IC) disposed on a first surface of the connection member and electrically connected to the at least one wiring layer; and
   an antenna package disposed on a second surface of the connection member, and including a dielectric layer, a plurality of antenna members configured to transmit and/or receive a first radio frequency (RF) signal, and a plurality of feed vias in which a first end of each thereof is electrically connected to each of the plurality of antenna members and a second end of each thereof is electrically connected to a corresponding wire of the at least one wiring layer,
   wherein the antenna package further includes a chip antenna including a dielectric body, and a first electrode and a second electrode respectively disposed on first and second surfaces of the dielectric body,
   wherein the chip antenna is disposed to be spaced apart from the plurality of feed vias within the dielectric layer so that at least one of the first electrode or the second electrode is electrically connected to a corresponding wire of the at least one wiring layer, and configured to transmit and/or receive a second RF signal.

2. The antenna module of claim 1, wherein the dielectric body has a dielectric constant Dk greater than a dielectric constant of the at least one insulating layer.

3. The antenna module of claim 2, wherein the dielectric layer has the dielectric constant greater than the dielectric constant of the at least one insulating layer and has the dielectric constant smaller than the dielectric constant Dk of the dielectric body.

4. The antenna module of claim 1, wherein the dielectric layer is disposed to surround a side surface of each of the plurality of feed vias and has a height higher than a height of the at least one insulating layer.

5. The antenna module of claim 1, wherein the chip antenna is disposed so that a normal direction of the first and second surfaces of the dielectric body is different from a direction extending from one end to another end of the plurality of feed vias.

6. The antenna module of claim 1, wherein the antenna package further includes a plating member blocking between the plurality of feed vias and the chip antenna and disposed to surround each of the plurality of feed vias, and
a portion of the plating member extends toward at least one of the plurality of feed vias on the second surface of the connection member.

7. The antenna module of claim 1, wherein the antenna package further includes a chip antenna reflector member disposed between the plurality of feed vias and the chip antenna, and
the first electrode is disposed between the chip antenna reflector member and the second electrode and has a surface smaller than a surface of the chip antenna reflector member and greater than a surface of the second electrode.

8. The antenna module of claim 1, wherein the antenna package includes a chip antenna director member, and
the second electrode is disposed between the chip antenna director member and the first electrode and has a surface greater than a surface of the chip antenna director member and smaller than a surface of the first electrode.

9. The antenna module of claim 1, wherein the antenna package further includes:
an encapsulation member disposed on the dielectric layer; and
a plurality of director members each disposed between a corresponding antenna member of the plurality of antenna members and the encapsulation member.

10. The antenna module of claim 9, wherein a portion of the encapsulation member is in contact with the chip antenna.

11. The antenna module of claim 9, further comprising an encapsulant encapsulating at least a portion of the IC,
wherein the dielectric body has a dielectric constant greater than a dielectric constant of the encapsulant and greater than a dielectric constant of the encapsulation member.

12. The antenna module of claim 1, further comprising:
a passive component disposed on the first surface of the connection member and electrically connected to a corresponding wire of the at least one wiring layer; and
an encapsulant encapsulating at least portions of the passive component and the IC.

13. The antenna module of claim 12, wherein the first electrode of the chip antenna is electrically connected to the IC, and
the second electrode of the chip antenna is electrically connected to the passive component.

14. The antenna module of claim 1, further comprising:
a support member disposed on the first surface of the connection member and providing an accommodating space; and
a passive component disposed in the accommodating space and electrically connected to a corresponding wire of the at least one wiring layer.

15. The antenna module of claim 1, further comprising:
a support member disposed on the first surface of the connection member to surround the IC and including at least one core via electrically connected to a corresponding wire of the at least one wiring layer; and
a core plating member disposed on side surfaces of the support member to surround side surface of the IC.

16. The antenna module of claim 15, wherein the IC is configured to receive a base signal from the core via and generate the first and second RF signals of a millimeter wave (mmWave) band, based on the base signal.

17. The antenna module of claim 1, further comprising:
a support member disposed on the first surface of the connection member and providing an accommodating space; and
a second chip antenna disposed in the accommodating space, including a second dielectric body and third and fourth electrodes disposed on first and second surfaces of the second dielectric body, and configured to transmit and/or receive a third RF signal.

18. An antenna module comprising:
a connection member including at least one wiring layer and at least one insulating layer;
an integrated circuit (IC) disposed on a first surface of the connection member and electrically connected to at least one wiring layer;
an antenna package disposed on a second surface of the connection member, and including a dielectric layer, a plurality of antenna members configured to transmit and/or receive a first radio frequency (RF) signal, and a plurality of feed vias in which a first end of each thereof is electrically connected to each of the plurality of antenna members and a second end of each thereof is electrically connected to a corresponding wire of the at least one wiring layer; and
a chip antenna including a dielectric body, and a first electrode and a second electrode respectively disposed on first and second surfaces of the dielectric body,
wherein the chip antenna is disposed on the first surface of the connection member so that at least one of the first electrode or the second electrode is electrically connected to a corresponding wire of the at least one wiring layer, and configured to transmit and/or receive a second RF signal.

19. The antenna module of claim 18, wherein the dielectric layer is disposed to surround a side surface of each of the plurality of feed vias, has a height higher than a height of the at least one insulating layer, and has a dielectric constant smaller than a dielectric constant of the dielectric body.

* * * * *